US012805308B2

(12) United States Patent
Liu et al.

(10) Patent No.: US 12,805,308 B2
(45) Date of Patent: Nov. 17, 2026

(54) INTEGRATED DEVICE AND INTEGRATED PASSIVE DEVICE COMPRISING INDUCTIVELY COUPLED INDUCTORS SURROUNDED BY A MAGNETIC MATERIAL

(71) Applicant: QUALCOMM Incorporated, San Diego, CA (US)

(72) Inventors: Kai Liu, San Diego, CA (US); Jui-Yi Chiu, Taichung City (TW); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 425 days.

(21) Appl. No.: 18/475,080

(22) Filed: Sep. 26, 2023

(65) Prior Publication Data

US 2025/0105145 A1 Mar. 27, 2025

(51) Int. Cl.

| | |
|---|---|
| ***H10W 20/40*** | (2026.01) |
| ***H10W 20/00*** | (2026.01) |
| ***H10W 20/42*** | (2026.01) |

(52) U.S. Cl.

CPC ......... *H10W 20/497* (2026.01); *H10W 20/01* (2026.01); *H10W 20/42* (2026.01)

(58) Field of Classification Search

CPC . H10W 20/497; H10W 44/501; H10W 20/01; H10W 20/42; H10W 90/00; H10W 70/05; H10W 70/685; H01F 17/0013; H01F 17/0033; H01F 41/046; H10D 1/20

See application file for complete search history.

(56) References Cited

U.S. PATENT DOCUMENTS

| | | | |
|---|---|---|---|
| 2014/0027880 A1 | 1/2014 | Duevel et al. | |
| 2015/0371764 A1 | 12/2015 | Gordin et al. | |
| 2017/0062120 A1 | 3/2017 | Yun et al. | |
| 2018/0374803 A1* | 12/2018 | Aoki | H10P 72/74 |
| 2019/0164681 A1* | 5/2019 | Kidwell, Jr. | H01F 17/0033 |

FOREIGN PATENT DOCUMENTS

| | | |
|---|---|---|
| CN | 111584457 A | 8/2020 |
| CN | 111584458 A | 8/2020 |

OTHER PUBLICATIONS

International Search Report and Written Opinion—PCT/US2024/046401—ISA/EPO—Dec. 13, 2024.

* cited by examiner

*Primary Examiner* — Wasiul Haider
(74) *Attorney, Agent, or Firm* — Loza & Loza, LLP

(57) ABSTRACT

A device comprising a die substrate; a plurality of interconnects located over the die substrate, wherein the plurality of interconnects comprise a first plurality of interconnects comprising a first plurality of via interconnects, wherein the first plurality of interconnects are configured as a first inductor; and a second plurality of interconnects comprising a second plurality of via interconnects, wherein the second plurality of interconnects are configured as a second inductor; wherein the first inductor and the second inductor are intertwined, at least one magnetic layer that surrounds at least part of the first plurality of via interconnects and at least part of the second plurality of via interconnects; and at least one dielectric layer located over the die substrate.

20 Claims, 21 Drawing Sheets

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

1ST LAYER

PLAN VIEW

2ND LAYER

PLAN VIEW

COMBINED LAYERS

PLAN VIEW

PROFILE CROSS SECTIONAL VIEW

900

DIELECTRIC LAYER FORMATION

11

BUMP FORMATION

14

INTEGRATED DEVICE AND INTEGRATED PASSIVE DEVICE COMPRISING INDUCTIVELY COUPLED INDUCTORS SURROUNDED BY A MAGNETIC MATERIAL

FIELD

Various features relate to packages, integrated devices and/or integrated passive devices.

BACKGROUND

Packages can include a substrate, an integrated device and integrated passive device. The substrate may include a plurality of interconnects. The integrated device and/or the integrated passive device may be coupled to interconnects of the substrate. There is an ongoing need to provide smaller packages with improved performances.

SUMMARY

Various features relate to packages, integrated devices and/or integrated passive devices.

One example provides a device comprising a die substrate; a plurality of interconnects located over the die substrate, wherein the plurality of interconnects comprise a first plurality of interconnects comprising a first plurality of via interconnects, wherein the first plurality of interconnects are configured as a first inductor; and a second plurality of interconnects comprising a second plurality of via interconnects, wherein the second plurality of interconnects are configured as a second inductor; wherein the first inductor and the second inductor are intertwined, at least one magnetic layer that surrounds at least part of the first plurality of via interconnects and at least part of the second plurality of via interconnects; and at least one dielectric layer located over the die substrate.

Another example provides a method that provides a die substrate. The method forms a plurality of interconnects located over the die substrate. The plurality of interconnects comprise a first plurality of interconnects comprising a first plurality of via interconnects, wherein the first plurality of interconnects are configured as a first inductor; and a second plurality of interconnects comprising a second plurality of via interconnects, wherein the second plurality of interconnects are configured as a second inductor, wherein the first inductor and the second inductor are intertwined. The method forms at least one magnetic layer that surrounds at least part of the first plurality of via interconnects and at least part of the second plurality of via interconnects. The method forms at least one dielectric layer located over the die substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device comprising a die substrate; a plurality of interconnects located over the die substrate, where the plurality of interconnects comprise a first plurality of interconnects comprising a first plurality of via interconnects, where the first plurality of interconnects are configured as a first inductor; and a second plurality of interconnects comprising a second plurality of via interconnects, where the second plurality of interconnects are configured as a second inductor; where the first inductor and the second inductor are intertwined, at least one magnetic layer that surrounds at least part of the first plurality of via interconnects and at least part of the second plurality of via interconnects; and at least one dielectric layer located over the die substrate. The at least one magnetic layer includes an insulating layer, a dielectric layer and/or a non-electrical conducting material. The at least one magnetic layer has a permeability value (e.g., relative permeability value) that is greater than 1. The magnetic layer is configured to help improve (e.g., increase) the quality factor (Q) and/or the inductance of the inductor. As will be further described below, by helping to improve the quality factor and/or the inductance of the inductor, one or more inductors with a smaller form factor (e.g., size) may be formed while still having a quality factor and/or an inductance that is equal or better than that of a larger inductor.

Figure 1:
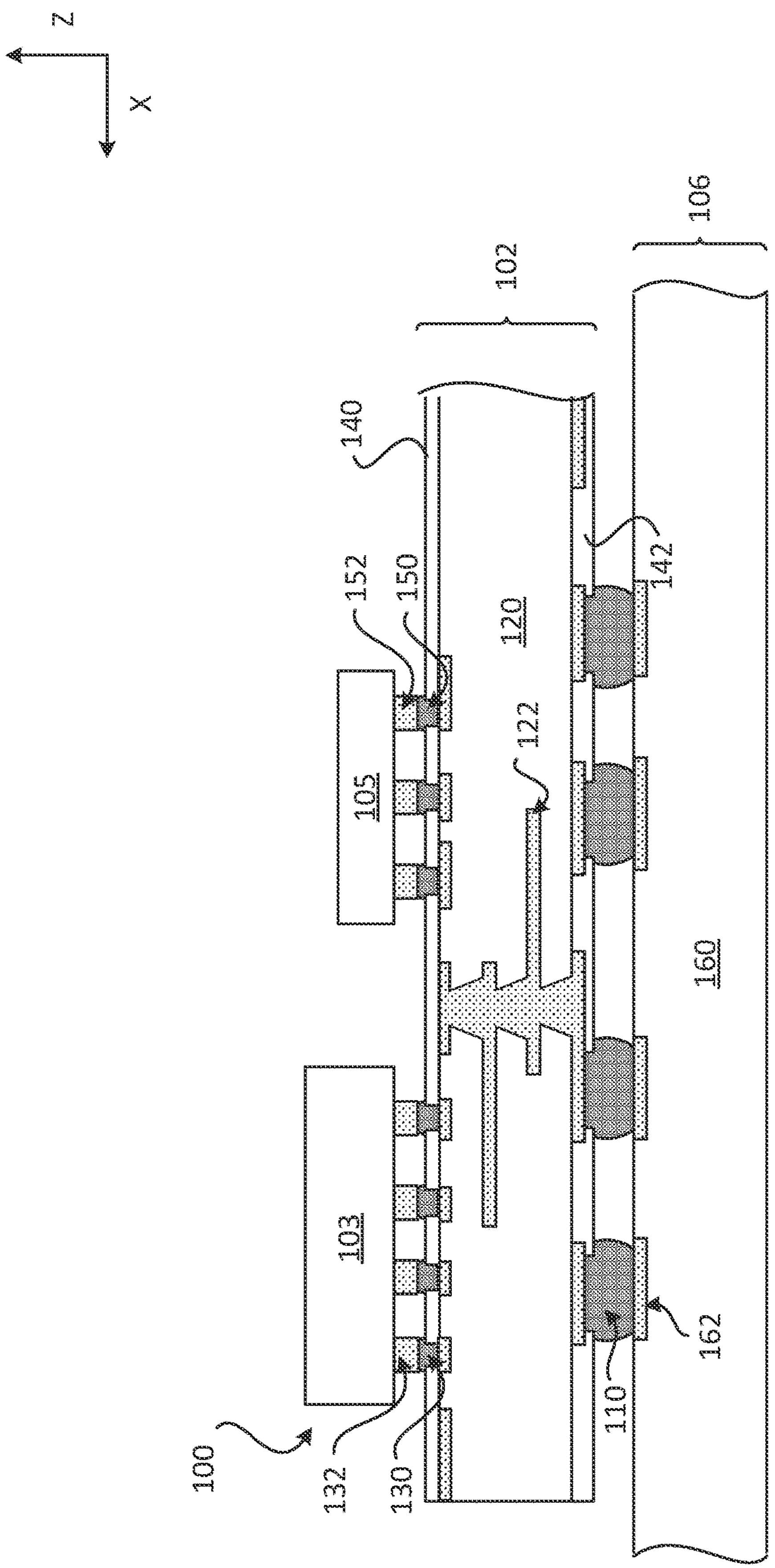
FIG. 1 illustrates an exemplary profile view of a package that includes a substrate, an integrated device and an integrated passive device.

Exemplary Integrated Device Comprising a Magnetic Material and Integrated Passive Device Comprising a Magnetic Material FIG. 1 illustrates a profile view of a package 100 that includes a substrate 102, an integrated device 103 and an integrated passive device 105 (IPD). The package 100 is coupled to a board 106 through a plurality of solder interconnects 110. The board 106 includes at least one board dielectric layer 160 and a plurality of board interconnects 162. The board 106 may include a printed circuit board (PCB).

The substrate 102 includes at least one dielectric layer 120 (e.g., substrate dielectric layer), a plurality of interconnects 122 (e.g., substrate interconnects), a solder resist layer 140 and a solder resist layer 142. The integrated device 103 may be coupled to the substrate 102 through a plurality of solder interconnects 130. The integrated device 103 may be coupled to the substrate 102 through a plurality of pillar interconnects 132 and the plurality of solder interconnects 130. The integrated passive device 105 may be coupled to the substrate 102 through a plurality of solder interconnects 150. The integrated passive device 105 may be coupled to the substrate 102 through a plurality of pillar interconnects 152 and the plurality of solder interconnects 150. A substrate may have a different number of metal layers. Different implementations may use different substrates. The substrate may include an embedded trace substrate (ETS). The at least one dielectric layer 120 may include prepreg.

The package (e.g., 100) may be implemented in a radio frequency (RF) package. The RF package may be a radio frequency front end (RFFE) package. A package (e.g., 100) may be configured to provide Wireless Fidelity (WiFi) communication and/or cellular communication (e.g., 2G, 3G, 4G, 5G). The package (e.g., 100.) may be configured to support Global System for Mobile (GSM) Communications, Universal Mobile Telecommunications System (UMTS), and/or Long-Term Evolution (LTE). The package (e.g., 100) may be configured to transmit and receive signals having different frequencies and/or communication protocols.

As will be further described below, the integrated device 103 and/or the integrated passive device 105 may include at least one magnetic layer. The at least one magnetic layer is configured to improve the inductance and/or quality factor of one or more inductors that are located in and/or surrounded by a magnetic layer. With improved inductor performance, smaller and more compact inductors may be formed in the integrated device 103 and/or the integrated passive device 105. As will be further described below, the integrated device 103 and/or the integrated passive device 105 may include a transformer that comprises a first inductor and a second inductor. The first inductor may be intertwined with the second inductor. The first inductor may include a first solenoid inductor and the second inductor may include a second solenoid inductor. The first inductor and the second inductor may be configured as inductively coupled inductors, where a current passing through the first inductor is configured to induce a current in the second inductor, and vice versa.

Figure 2:
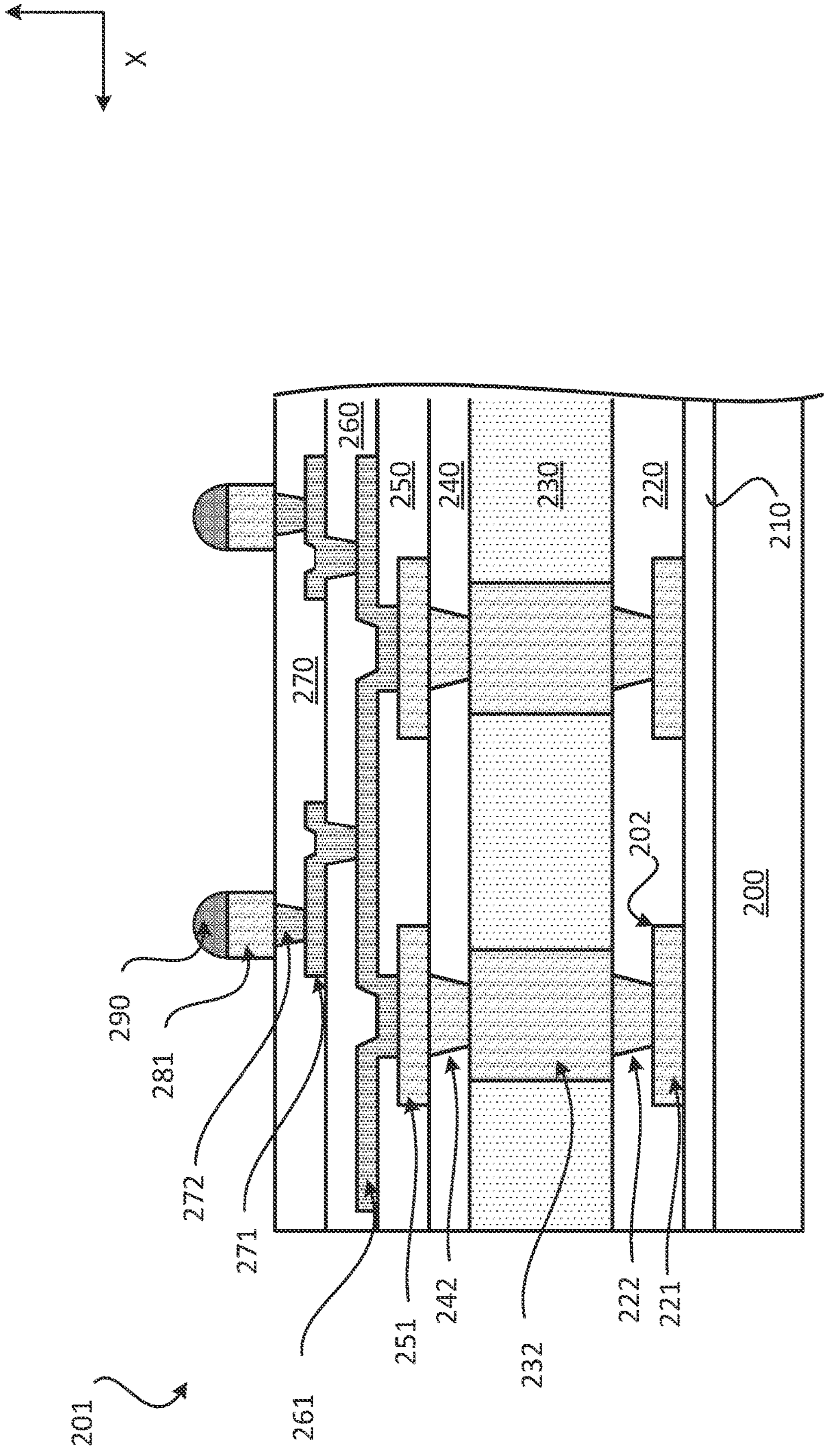
FIG. 2 illustrates an exemplary profile view of an integrated passive device that includes a magnetic material that surrounds interconnects.

FIG. 2 illustrates an exemplary profile cross sectional view of an integrated passive device 201. The integrated passive device 201 includes a die substrate 200, a dielectric layer 210, a dielectric layer 220, at least one magnetic layer 230, a dielectric layer 240, a dielectric layer 250, a dielectric layer 260, and a dielectric layer 270. The integrated passive device 201 may also include a plurality of interconnects 202. The plurality of interconnects 202 may include at least one interconnect 221, at least one interconnect 222, at least one interconnect 232, at least one interconnect 242, at least one interconnect 251, at least one interconnect 261, at least one interconnect 271, at least one interconnect 272 and/or at least one interconnect 281. The at least one interconnect 281 may include at least one pillar interconnects. A plurality of solder interconnects 290 are coupled to the at least one interconnect 281. As will be further described below, at least some of the interconnects from the plurality of interconnects 202 are configured to operate as a transformer comprising a first inductor and a second inductor, where the second inductor is intertwined with the first inductor. The first inductor and the second inductor may be configured as inductively coupled inductors, where a current passing through the first inductor is configured to induce a current in the second inductor, and vice versa. The integrated passive device 201 may be an example of the integrated passive device 105.

The die substrate 200 may include silicon (Si). The die substrate 200 may include a wafer. The die substrate 200 may be free of transistors. The dielectric layer 210 is coupled to a surface of the die substrate 200. The dielectric layer 210, the dielectric layer 220, the dielectric layer 240, the dielectric layer 250, the dielectric layer 260 and the dielectric layer 270 may be represented as one or more dielectric layers. Thus, in some implementations, one or more dielectric layers may represent the dielectric layer 210, the dielectric layer 220, the dielectric layer 240, the dielectric layer 250, the dielectric layer 260 and/or the dielectric layer 270. The dielectric layer 210, the dielectric layer 220, the dielectric layer 240, the dielectric layer 250, the dielectric layer 260 and/or the dielectric layer 270 may include one or more polyimide (PI). In some implementations, the dielectric layer 270 may include a passivation layer.

The at least one interconnect 221 is located over the dielectric layer 210. The at least one interconnect 222 is coupled to the at least one interconnect 232 and the at least one interconnect 221. The at least one interconnect 232 is coupled to the at least one interconnect 242. The at least one interconnect 242 is coupled to the at least one interconnect 251. The at least one interconnect 251 is coupled to the at least one interconnect 261. The at least one interconnect 261 is coupled to the at least one interconnect 271. The at least one interconnect 271 is coupled to the at least one interconnect 272. The at least one interconnect 272 is coupled to the at least one interconnect 281. The at least one interconnect 221, the at least one interconnect 222, the at least one interconnect 232, the at least one interconnect 242, the at least one interconnect 251, the at least one interconnect 261, the at least one interconnect 271, the at least one interconnect 272 and the at least one interconnect 281 may include copper. The at least one interconnect 221, the at least one interconnect 222, the at least one interconnect 232, the at least one interconnect 242, the at least one interconnect 251, and/or the at least one interconnect 261 may be configured to operate as a transformer comprising a first inductor and a second inductor, where the second inductor is intertwined with the first inductor. The at least one interconnect 221, the at least one interconnect 222, the at least one interconnect 232, the at least one interconnect 242, the at least one interconnect 251, and/or the at least one interconnect 261 may be configured to operate as inductively coupled inductors comprising a first inductor and a second inductor, where a current passing through the first inductor is configured to induce a current in the second inductor, and vice versa.

The plurality of interconnects 202 may include a plurality of metallization interconnects. That is for example, in some implementations, at least some of the interconnects from the plurality of interconnects 202 may be implemented as a plurality of metallization interconnects. A plurality of metallization interconnects may include a plurality of redistribution interconnects (e.g., redistribution layer (RDL) interconnects). The at least one interconnect 222 may include via interconnects. The at least one interconnect 232 may include via interconnects. The at least one interconnect 242 may include via interconnects. The magnetic layer 230 may laterally surround and touch the at least one interconnect 232. The at least one dielectric layer 220 may be located below the magnetic layer 230. The at least one dielectric layer 240 may be located above the magnetic layer 230.

As mentioned above, the integrated passive device 201 includes at least one magnetic layer 230. The at least one magnetic layer 230 may include one or more magnetic layers. The at least one magnetic layer 230 includes an insulating layer, a dielectric layer and/or a non-electrical conducting material (e.g., material that does not electrically conduct). The at least one magnetic layer 230 may be both a dielectric material and a magnetic material. Thus, the at least one magnetic layer 230 may have both dielectric properties and magnetic properties. The at least one magnetic layer 230 may include one or more materials. The at least one magnetic layer 230 has a permeability value that is greater than 1 (e.g., about 10 or greater, range of 6-12). The magnetic layer 230 may have different permeability values at different frequencies. The permeability value of a magnetic material and/or a magnetic layer, as described in the disclosure is a relative permeability value that is defined as a ratio of the permeability of a material to the permeability of free space. Thus, the permeability values that are described for the magnetic materials and/or magnetic layers that are illustrated and/or described in the disclosure may represent a relative permeability value that is relative to a defined permeability value (e.g., reference permeability value) of free space. In some implementations, free space may be defined to have a defined permeability value of $\mu_0=4\pi\times10^{-7}$ H/m (Henry per meter). A material that has a relative permeability value that is greater than 1 may be considered to be a magnetic material. Similarly, a material layer that has a relative permeability value that is greater than 1 may be considered to be a magnetic layer. The at least one magnetic layer 230 may include a magnetic loss tangent value that is in a range of about 0.01-0.04. For example, the at least one magnetic layer may include a magnetic loss tangent value that is in a range of about 0.01-0.04 for frequencies up to 100 MHz. The at least one magnetic layer 230 may include may include various magnetic materials. For example, the at least one magnetic layer 230 may include Ajinomoto Magnetic Film (AMF). The at least one magnetic layer 230 is configured to improve the inductance and/or quality factor of an inductor that is located in and/or surrounded by the at least one magnetic layer 230. With improved inductor performance, smaller and more compact inductors may be formed in the integrated passive device and/or the integrated device.

Figure 3:
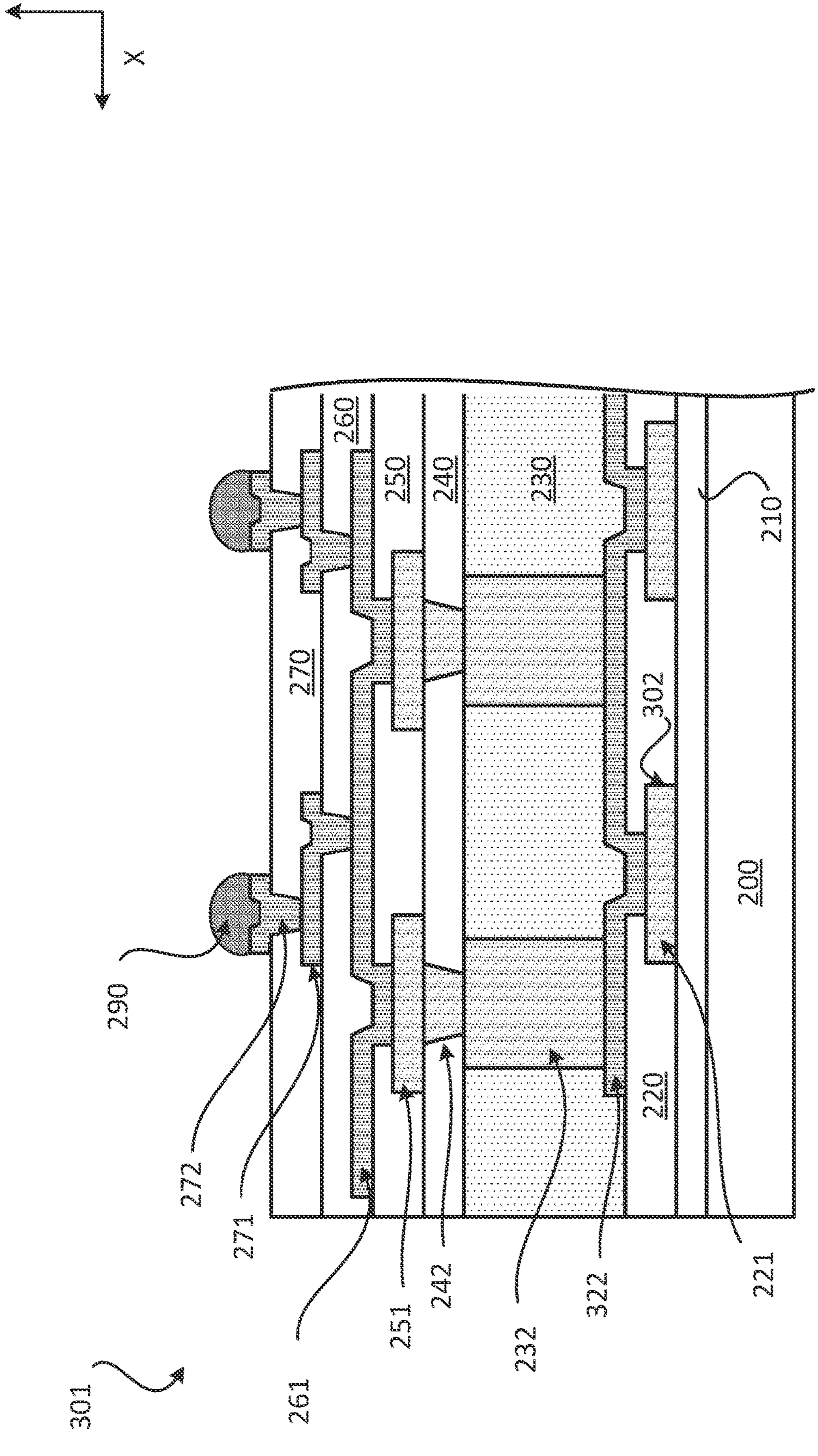
FIG. 3 illustrates an exemplary profile view of an integrated passive device that includes a magnetic material that surrounds interconnects.

FIG. 3 illustrates an exemplary profile cross sectional view of an integrated passive device 301. The integrated passive device 301 is similar to the integrated passive device 201 and may include similar and/or the same components as the integrated passive device 201 arranged in a similar manner. The integrated passive device 301 includes a die substrate 200, a dielectric layer 210, a dielectric layer 220, at least one magnetic layer 230, a dielectric layer 240, a dielectric layer 250, a dielectric layer 260, and a dielectric layer 270. The integrated passive device 201 may also include a plurality of interconnects 302. The plurality of interconnects 302 may include at least one interconnect 221, at least one interconnect 322, at least one interconnect 232, at least one interconnect 242, at least one interconnect 251, at least one interconnect 261, at least one interconnect 271, and/or at least one interconnect 272. The at least one interconnect 272 may include at least one under bump metallization interconnect. A plurality of solder interconnects 290 are coupled to the at least one interconnect 272. The at least one interconnect 221 is coupled to the at least one interconnect 322. The at least one interconnect 322 is coupled to the at least one interconnect 232. The at least one interconnect 232 is coupled to the at least one interconnect 242. The at least one interconnect 242 is coupled to the at least one interconnect 251. The at least one interconnect 252 is coupled to the at least one interconnect 261. At least some of the interconnects from the plurality of interconnects 302 are configured to operate as a transformer comprising a first inductor and a second inductor, where the second inductor is intertwined with the first inductor. At least some of the interconnects from the plurality of interconnects 302 are configured to operate as inductively coupled inductors comprising a first inductor and a second inductor, where the second inductor is intertwined with the first inductor. The first inductor and the second inductor may be configured as inductively coupled inductors, where a current passing through the first inductor is configured to induce a current in the second inductor, and vice versa. The integrated passive device 301 may be an example of the integrated passive device 105.

Figure 4:
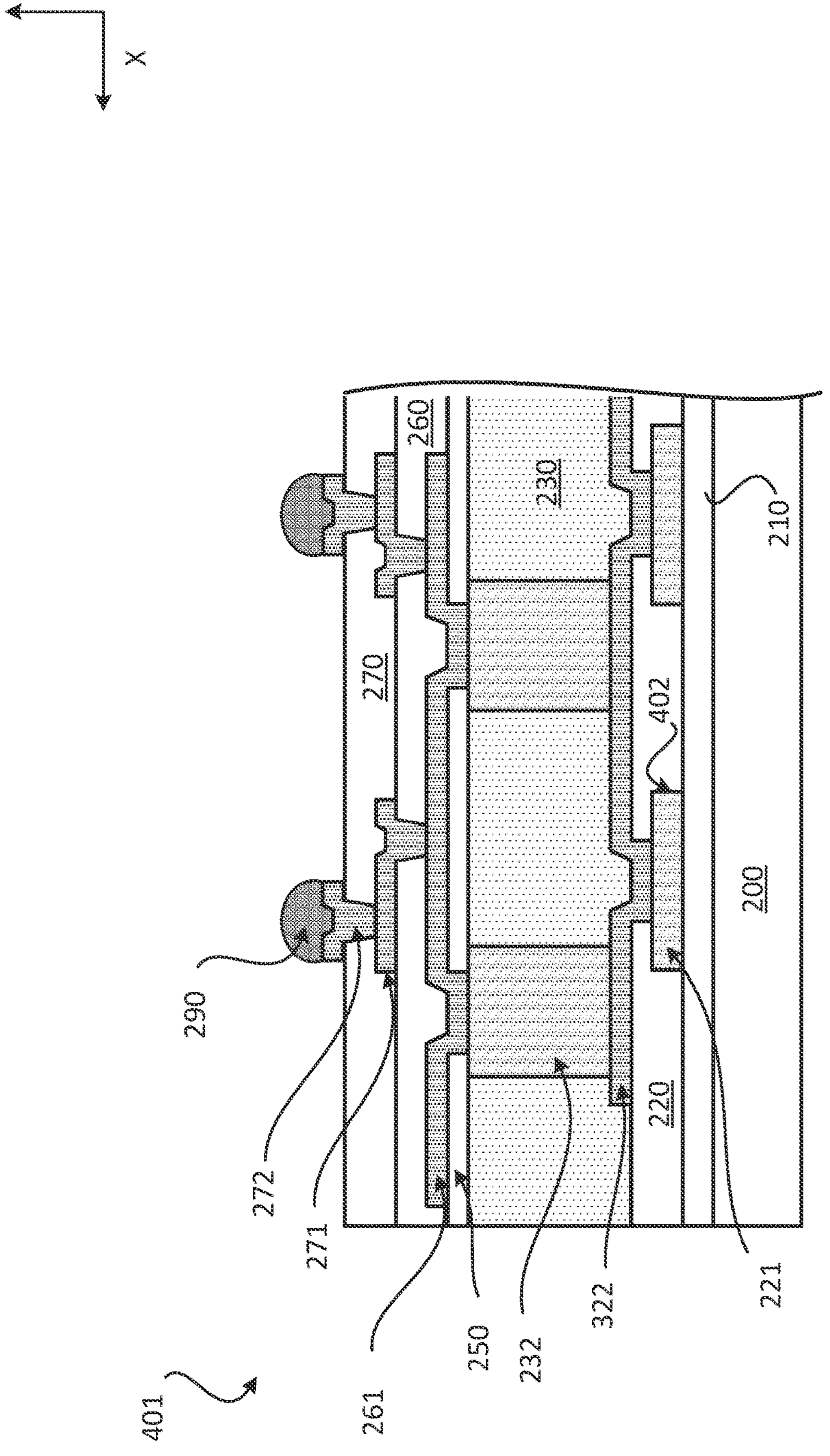
FIG. 4 illustrates an exemplary profile view of an integrated passive device that includes a magnetic material that surrounds interconnects.

FIG. 4 illustrates an exemplary profile cross sectional view of an integrated passive device 401. The integrated passive device 401 is similar to the integrated passive device 201 and/or the integrated passive device 301, and may include similar and/or the same components as the integrated passive device 201 and/or the integrated passive device 301, arranged in a similar manner. The integrated passive device 401 includes a die substrate 200, a dielectric layer 210, a dielectric layer 220, at least one magnetic layer 230, a dielectric layer 250, a dielectric layer 260, and a dielectric layer 270. The integrated passive device 401 may also include a plurality of interconnects 402. The plurality of interconnects 402 may include at least one interconnect 221, at least one interconnect 322, at least one interconnect 232, at least one interconnect 261, at least one interconnect 271, and/or at least one interconnect 272. The at least one interconnect 272 may include at least one under bump metallization interconnect. A plurality of solder interconnects 290 are coupled to the at least one interconnect 272. At least some of the interconnects from the plurality of interconnects 402 are configured to operate as a transformer comprising a first inductor and a second inductor, where the second inductor is intertwined with the first inductor. At least some of the interconnects from the plurality of interconnects 402 are configured to operate as inductively coupled inductors comprising a first inductor and a second inductor, where the second inductor is intertwined with the first inductor. The first inductor and the second inductor may be configured as inductive coupled inductors, where a current passing through the first inductor is configured to induce a current in the second inductor, and vice versa. The integrated passive device 401 may be an example of the integrated passive device 105.

The at least one interconnect 221 is coupled to the at least one interconnect 322. The at least one interconnect 322 is coupled to the at least one interconnect 232. The at least one interconnect 232 is coupled to the at least one interconnect 261. The at least one interconnect 261 is coupled to the at least one interconnect 271. The at least one interconnect 271 is coupled to the at least one interconnect 272. In some implementations, the at least one interconnect 221, the at least one interconnect 322, the at least one interconnect 232 and/or the at least one interconnect 261 may be configured to operate as a transformer comprising a first inductor and a second inductor, where the second inductor is intertwined with the first inductor. In some implementations, the at least one interconnect 221, the at least one interconnect 322, the at least one interconnect 232 and/or the at least one interconnect 261 may be configured to operate as inductive coupled inductors comprising a first inductor and a second inductor, where the second inductor is intertwined with the first inductor.

In some implementations, the at least one interconnect 322, the at least one interconnect 261 and the at least one interconnect 271 may include a plurality of metallization interconnects (e.g., redistribution interconnects).

Figure 5:
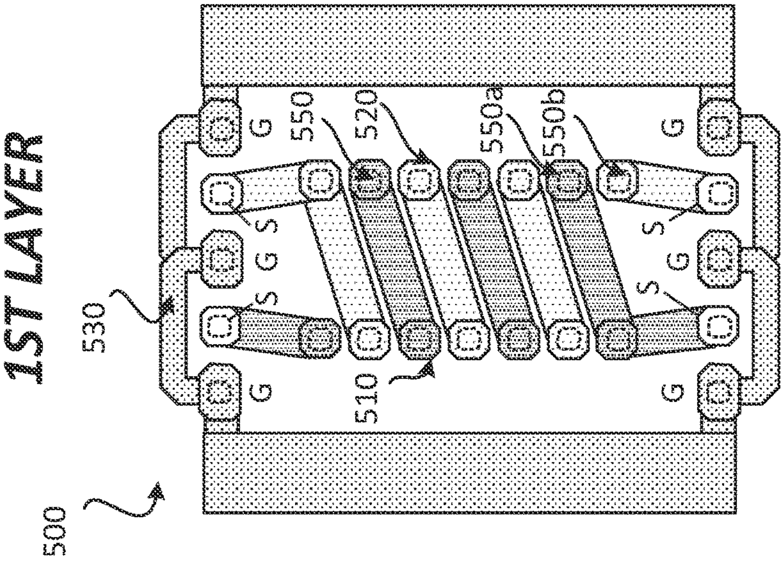
FIG. 5 illustrates a plan view of a metal layer of an integrated passive device.
Figure 6:
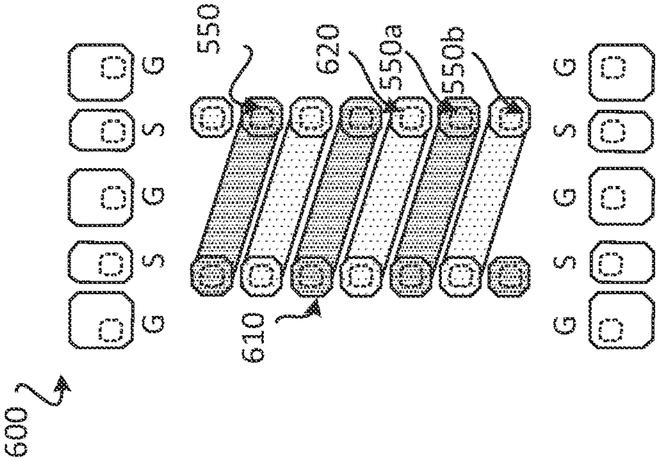
FIG. 6 illustrates a plan view of another metal layer of an integrated passive device.

FIGS. 5-6 illustrate plan views of a transformer, portions of a transformer, inductively coupled inductors and/or portions of inductively coupled inductors. FIG. 5 illustrates an exemplary plan view of a first metal layer comprising a plurality of interconnects 500. The plurality of interconnects 500 includes a first plurality of interconnects 510, a second plurality of interconnects 520, and a third plurality of interconnects 530. The first plurality of interconnects 510 are configured to be part of a first inductor. The second plurality of interconnects 520 are configured to be part of a second inductor. The third plurality of interconnects 530 are configured for ground. The third plurality of interconnects 530 may laterally surround the first plurality of interconnects 510 and the second plurality of interconnects 520. FIG. 5 also illustrates a plurality of via interconnects 550. The plurality of via interconnects 550 include a first plurality of via interconnects **550*a* and a second plurality of via interconnects 550*b*. The first plurality of via interconnects 550*a* may be coupled to the first plurality of interconnects 510. The second plurality of via interconnects 550*b* may be coupled to the first plurality of interconnects 520**.

FIG. 6 illustrates an exemplary plan view of a second metal layer comprising a plurality of interconnects 600. The plurality of interconnects 600 includes a first plurality of interconnects 610 and a second plurality of interconnects 620. The first plurality of interconnects 610 are configured to be part of a first inductor. The second plurality of interconnects 620 are configured to be part of a second inductor. FIG. 6 also illustrates the plurality of via interconnects 550. The plurality of via interconnects 550 include the first plurality of via interconnects **550*a* and the second plurality of via interconnects 550*b*. The first plurality of via interconnects 550*a* may be coupled to the first plurality of interconnects 610. The second plurality of via interconnects 550*b* may be coupled to the first plurality of interconnects 620**.

Figure 7:
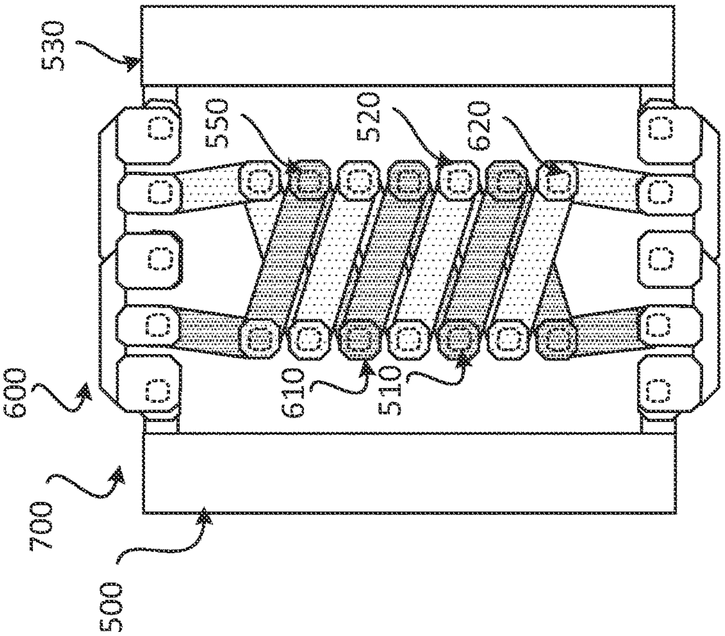
FIG. 7 illustrates a plan view of two metal layers of an integrated passive device.

FIG. 7 illustrates an exemplary plan view of a combined two metal layers. FIG. 7 illustrates a plurality of interconnects 700 that includes the plurality of interconnects 500, the plurality of interconnects 600 and the plurality of via interconnects 550. The first plurality of interconnects 610 may be coupled to the first plurality of interconnects 510 through the first plurality of via interconnects **550*a*. The second plurality of interconnects 620 may be coupled to the second plurality of interconnects 520 through the second plurality of via interconnects 550*b***.

The first plurality of interconnects 510, the first plurality of via interconnects **550*a* and the first plurality of interconnects 610 may be configured to operate as a first inductor (e.g., first solenoid inductor). The second plurality of interconnects 520, the second plurality of via interconnects 550*b* and the second plurality of interconnects 620 may be configured to operate as a second inductor (e.g., first solenoid inductor). FIG. 7 illustrates that the interconnects of the first inductor and the interconnects of the second inductor are intertwined. The first inductor and the second inductor may be configured and/or define a transformer and/or inductively coupled inductors. Inductively coupled inductors may include two inductors that are inductively coupled together such that a current passing through one inductor causes a current to pass through the other inductor. In some implementations, the first inductor may be configured to be inductively coupled to the second inductor. In some implementations, the second inductor may be configured to be inductively coupled to the first inductor. A first inductor and a second inductor of inductively coupled inductors may not directly touch each other. In some implementations, inductive coupling may mean inductive magnetic coupling. In some implementations, a transformer and/or inductively coupled inductors may be defined by the first plurality of interconnects 510, the first plurality of via interconnects 550*a*, the first plurality of interconnects 610, the second plurality of interconnects 520, the second plurality of via interconnects 550*b* and the second plurality of interconnects 620. Although not shown, a magnetic layer may at least laterally surround the plurality of via interconnects 550. In some implementations, a magnetic layer may be located within and/or around the windings of the first inductor and/or the second inductor. In some implementations, a magnetic layer may be located between the plurality of interconnects 500 and the plurality of interconnects 600. In some implementations, a magnetic layer may be located between the first plurality of interconnects 510 and the first plurality of interconnects 610. In some implementations, a magnetic layer may be located between the first plurality of interconnects 510 and the second plurality of interconnects 620. In some implementations, a magnetic layer may be located between the second plurality of interconnects 520 and the second plurality of interconnects 620. In some implementations, a magnetic layer may be located between the second plurality of interconnects 520 and the first plurality of interconnects 610**.

As mentioned above, the second inductor and the first inductor are configured to operate as inductively coupled inductors. In some implementations, the first inductor is configured to induce a current in the second inductor, and vice versa. The use of a magnetic layer helps improve inductive properties of the first inductor and/or the second inductor, such as the inductance and/or the Q factor for the first inductor and/or the second inductor. This may allow for smaller sized inductors that have an inductance and/or Q factors that are similar or greater than inductances and/or Q factors of relatively larger inductors. Smaller inductors can be implemented in smaller devices, which can help improve the overall performance of the smaller devices.

The first inductor, the second inductor, the transformer and/or inductively coupled inductors of FIG. 7 may be implemented in any of the integrated passive devices and/or integrated devices of the disclosure. The metal layer of FIG. 5 may represent any metal layer of an integrated passive device and/or an integrated device. Similarly, the metal layer of FIG. 6 may represent any metal layer of an integrated passive device and/or an integrated device. In some implementations, there may be one or more metal layers between the metal layer of FIG. 5 and the metal layer of FIG. 6. In some implementations, the metal layers of FIGS. 5-7 may be implemented in a metallization portion of an integrated passive device and/or a metallization portion of an integrated device. In some implementations, the inductors shown in FIGS. 5-7 may be implemented in more than two metal layers.

FIGS. 2-4 illustrate examples of integrated passive devices that include a transformer, inductively coupled inductors and/or at least one magnetic layer. In some implementations, the transformer, the inductively coupled inductors and/or the at least one magnetic layer may be implemented in an integrated device. Thus, for example, in some implementations, the die substrate 200 of FIGS. 2-4 may include an active region that includes active components, such as transistors and/or filters. Thus, the integrated passive devices of FIGS. 2-4 may represent integrated devices if an active region is located in and/or above the die substrate (e.g., 200).

Figure 8:
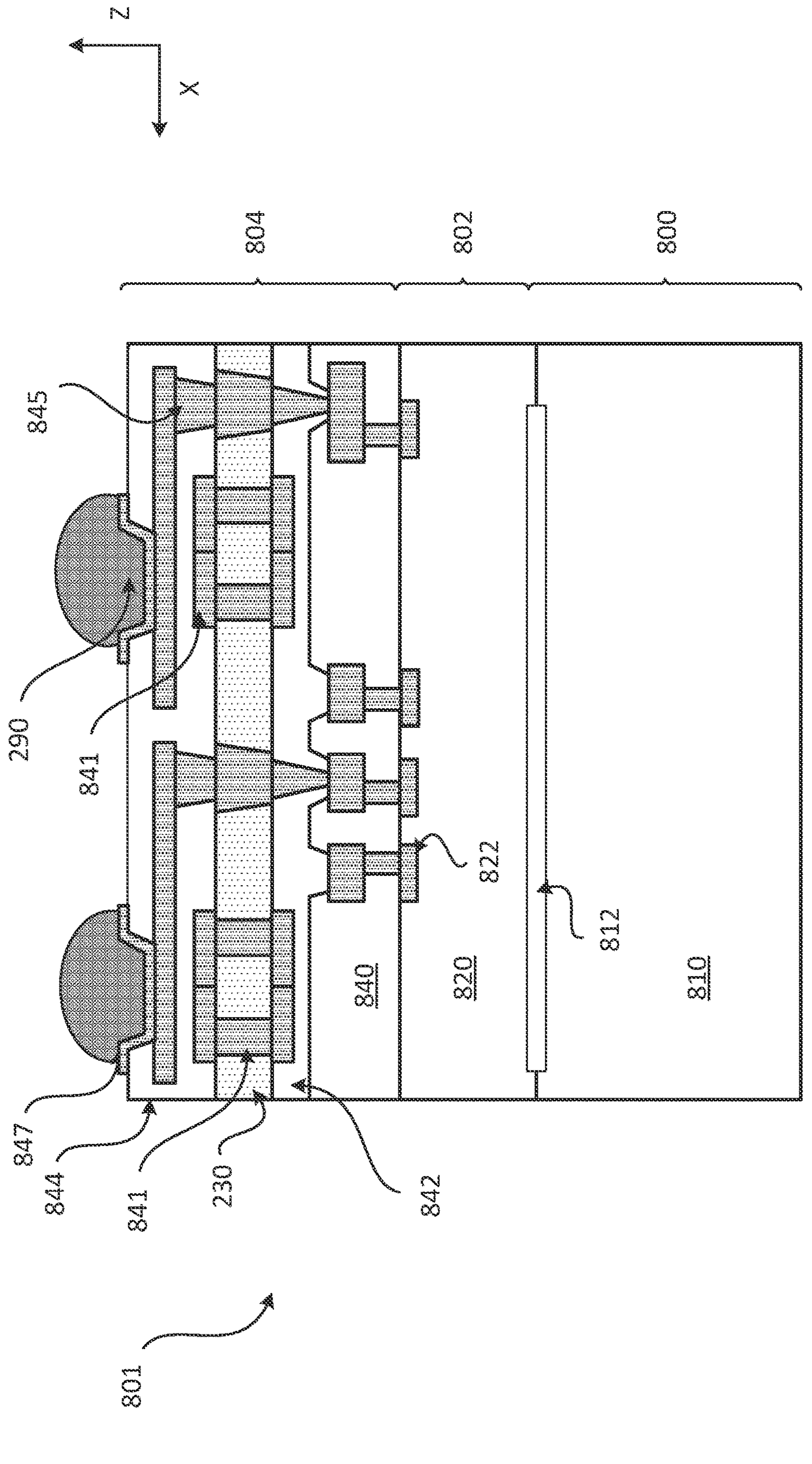
FIG. 8 illustrates an exemplary profile view of an integrated device that includes a magnetic material that surrounds interconnects.

FIG. 8 illustrates an example of an integrated device 801 that includes a transformer, inductively coupled inductors and at least one magnetic layer. The integrated device 801 includes a die substrate portion 800, a die interconnection portion 802, and a metallization portion 804. The die substrate portion 800 includes a die substrate 810 and an active region 812. The die substrate 810 may include silicon. The active region 812 may include transistors, filters and/or logic cells. A front end of line (FEOL) process may be used to form the active region 812.

The die interconnection portion 802 is coupled to the die substrate portion 800. The die interconnection portion 802 includes at least one dielectric layer 820 and a plurality of die interconnects 822. The plurality of die interconnects 822 may be configured to be electrically coupled to the active region 812. The die interconnection portion 802 may be fabricated using a back end of line (BEOL) process.

The metallization portion 804 is coupled to the die interconnection portion 802. The metallization portion 804 may include the at least one magnetic layer and a transformer (and/or inductively coupled inductors) that includes a first inductor and a second inductor that is intertwined with the first inductor. The metallization portion 804 includes at least one dielectric layer 840, at least one dielectric layer 842, at least one magnetic layer 230, a transformer 841, at least one dielectric layer 844, a plurality of interconnects 845 and a plurality of interconnects 847. The transformer 841 may be located at least partially in the at least one dielectric layer 842, the at least one magnetic layer 230 and/or the at least one dielectric layer 844. The transformer 841 may include a first inductor and a second inductor that is intertwined with the first inductor, such as the transformer illustrated and described in FIGS. 5-7. The transformer 841 may be defined from interconnects from the metallization portion 804. Examples of interconnects that define a transformer are illustrated and described in at least FIG. 2-4. The transformer 821 may include inductively coupled inductors. The plurality of interconnects 845 are coupled to the plurality of die interconnects 822. The plurality of interconnects 845 may be located in the at least one dielectric layer 840, the at least one dielectric layer 842, the magnetic layer 230, and/or the at least one dielectric layer 844. The plurality of interconnects 847 are coupled to the plurality of interconnects 845. The plurality of interconnects 845 may be coupled to the transformer 841. In some implementations, the transformer 841 may be defined from interconnects from the plurality of interconnects 845. In some implementations, some interconnects from the plurality of interconnects 845 may include metallization interconnects, such as redistribution interconnects. A plurality of solder interconnects 290 may be coupled to the plurality of interconnects 847. The integrated device 801 may be configured as a power management integrated circuit (PMIC).

Figure 9:
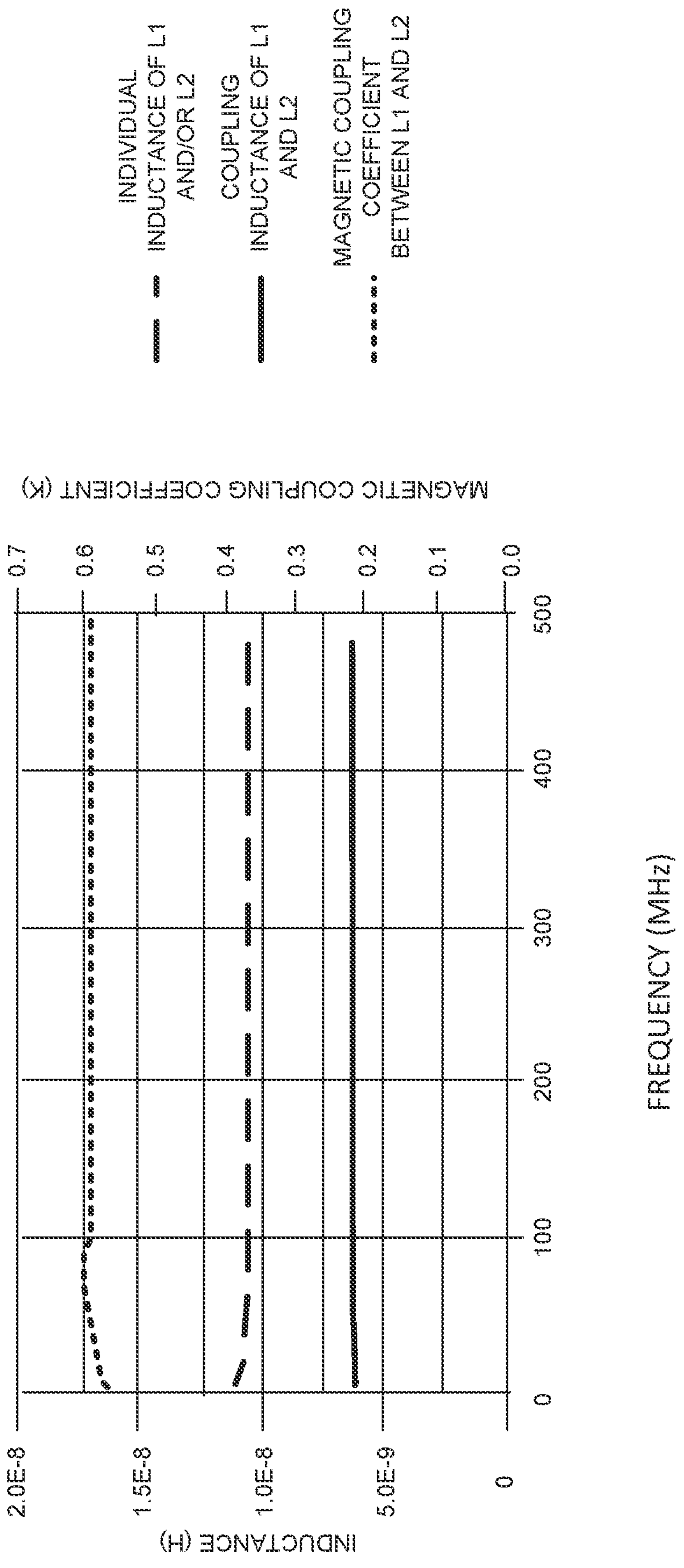
FIG. 9 illustrates an exemplary graph of inductance of inductors and/or inductively coupled inductors surrounded by a magnetic material.

FIG. 9 illustrate a graph of exemplary inductances for inductively coupled inductors that includes a first inductor and a second inductor. FIG. 9 illustrates an exemplary graph 900 that includes plot lines of inductances, coupling inductance and magnetic coupling coefficients of the inductors through various frequency for the transformer, a first inductor and a second inductor. As shown in FIG. 9, the magnetic coupling coefficient (K) between two inductors may be about 60%. A higher magnetic coupling coefficient (K) means a better transfer of energy between inductors. The coupling inductance between two inductors may be related to the magnetic coupling coefficient (K). A larger coupling inductance may mean a larger coupling coefficient (K) for a pair of inductors. It is noted that inductances, coupling inductances and magnetic coupling coefficients are exemplary and different implementations and/or configuration of the inductors may provide different inductances, coupling inductances and/or magnetic coupling coefficients.

An integrated device may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device may include at least one electronic circuit (e.g., first electronic circuit, second electronic circuit, etc. . . . ). An integrated device may include transistors. An integrated device may be an example of an electrical component and/or electrical device. In some implementations, an integrated device may include a chiplet. A chiplet may be fabricated using a process that provides better yields compared to other processes that are used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

Having described various integrated devices and/or integrated passive devices with at least one magnetic layer, a process for fabricating an integrated passive device with at least one magnetic layer will be described below.

Exemplary Sequence for Fabricating an Integrated Passive Device Comprising a Magnetic Layer FIGS. 10A-10J illustrate an exemplary sequence for providing or fabricating an integrated passive device comprising at least one magnetic layer. In some implementations, the sequence of FIGS. 10A-10J may be used to provide or fabricate the integrated passive device 105 and/or the integrated passive device 201 described in the disclosure. In some implementations, the sequence of FIGS. 10A-10J may be used to provide or fabricate any of the integrated passive devices and/or integrated devices described in the disclosure. For example, in some implementations, the sequence of FIGS. 10A-10J may be used to provide or fabricate the integrated device 103 and/or the integrated device 801.

It should be noted that the sequence of FIGS. 10A-10J may combine one or more stages in order to simplify and/or clarify the sequence for providing or fabricating an integrated passive device. In some implementations, the order of the processes may be changed or modified. In some implementations, one or more of processes may be replaced or substituted without departing from the spirit of the disclosure. Different implementations may fabricate an integrated passive device differently. The sequence shown in FIGS. 10A-10J may be implemented on a wafer (e.g., silicon wafer) and then singulated into several integrated passive devices. A similar approach may be implemented for integrated devices with a magnetic layer. Different implementations may have different configurations (e.g., different number) of metal layers. For example, some implementations may have more metal layers, while some implementations may have less metal layers. Different implementations may have different interconnects with different shapes.

Figure 10A:
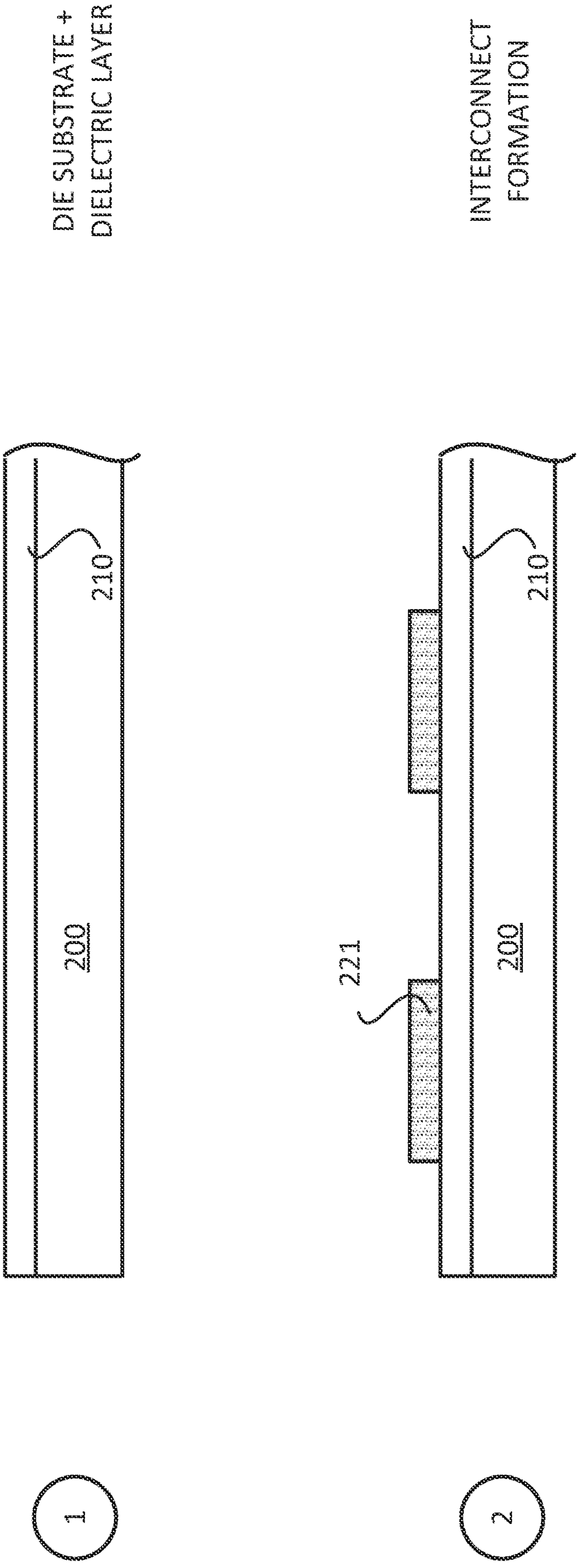
FIGS. 10A-10J illustrate an exemplary sequence for fabricating an integrated passive device that includes a magnetic material that surrounds interconnects.

Stage 1, as shown in FIG. 10A, illustrates a state after a die substrate 200 is provided. The die substrate 200 may include silicon (Si). A dielectric layer 210 may be located over a surface of the die substrate 200. The die substrate 200 may be provided with the dielectric layer 210. In some implementations, the dielectric layer 210 may be formed over the surface of the die substrate 200. Providing the die substrate 200 may include providing a wafer (e.g., silicon wafer). In some implementations, a die substrate 200 may be provided with an active region that includes a plurality of transistors, filters and/or logic cells.

Stage 2 illustrates a state after at least one interconnect 221 is formed over the dielectric layer 210. A plating process and a patterning process may be used to form the at least one interconnect 221.

Figure 10B:
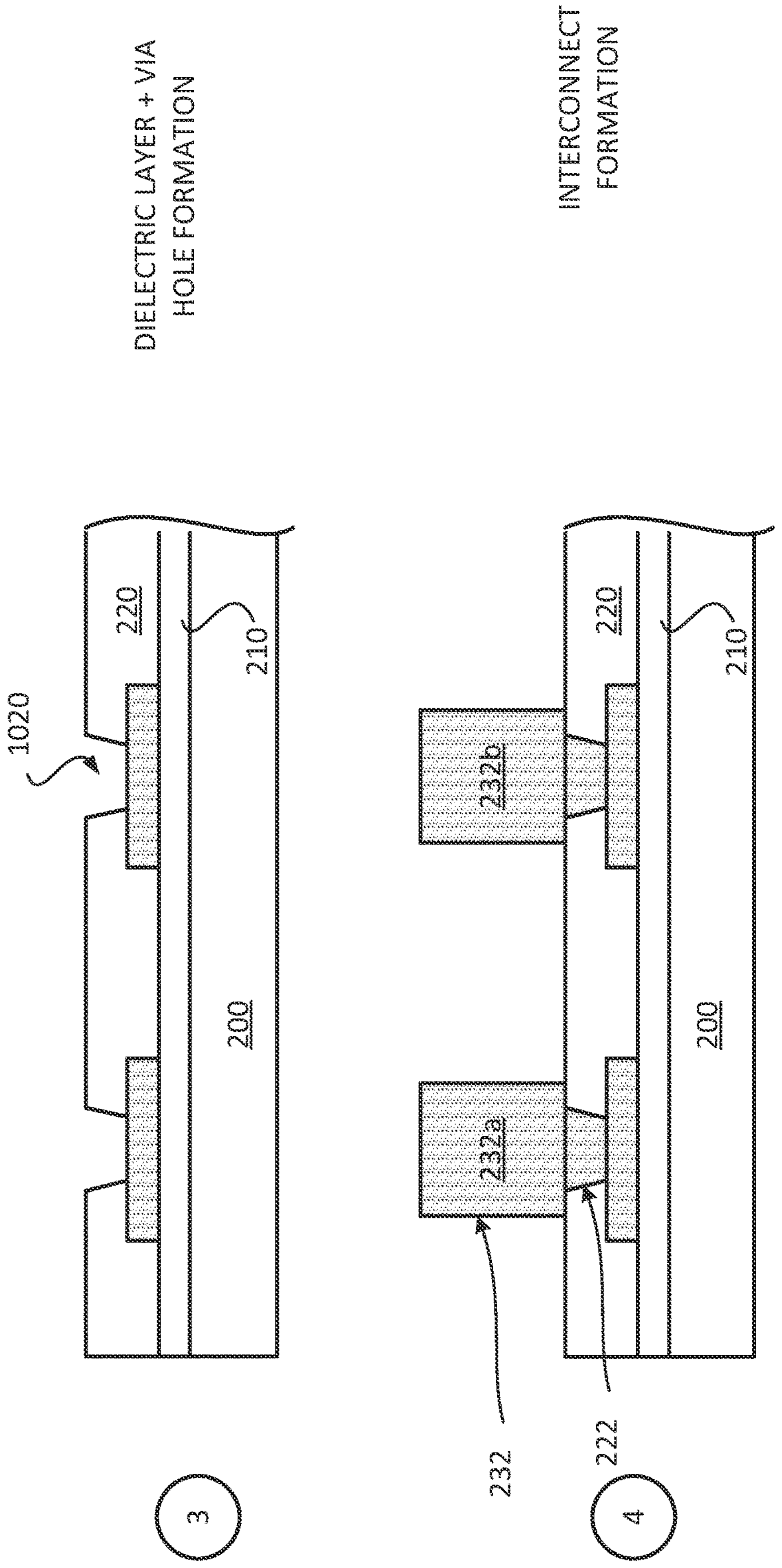

Stage 3, as shown in FIG. 10B, illustrates a state after at least one dielectric layer 220 is formed and patterned. A deposition, a lamination, an exposure, a development and/or an etching process may be used to form and pattern the at least one dielectric layer 220. The at least one dielectric layer 220 may be formed over and around the at least one interconnect 221. The at least one dielectric layer 220 may include at least one via-hole 1020.

Stage 4 illustrates a state after at least one interconnect 222 and at least one interconnect 232 are formed. A plating process and a patterning process may be used to form the at least one interconnect 222 and the at least one interconnect 232. Forming the at least one interconnect 222 may include forming via interconnects in the at least one via-hole 1020 of the at least one dielectric layer 220. The at least one interconnect 222 may be coupled to the at least one interconnect 221 and the at least one interconnect 232. The at least one interconnect 232 includes an interconnect 232*a* and an interconnect 232*b*. A width of the at least one interconnect 232 may be greater than a width of the at least one interconnect 222.

Figure 10C:
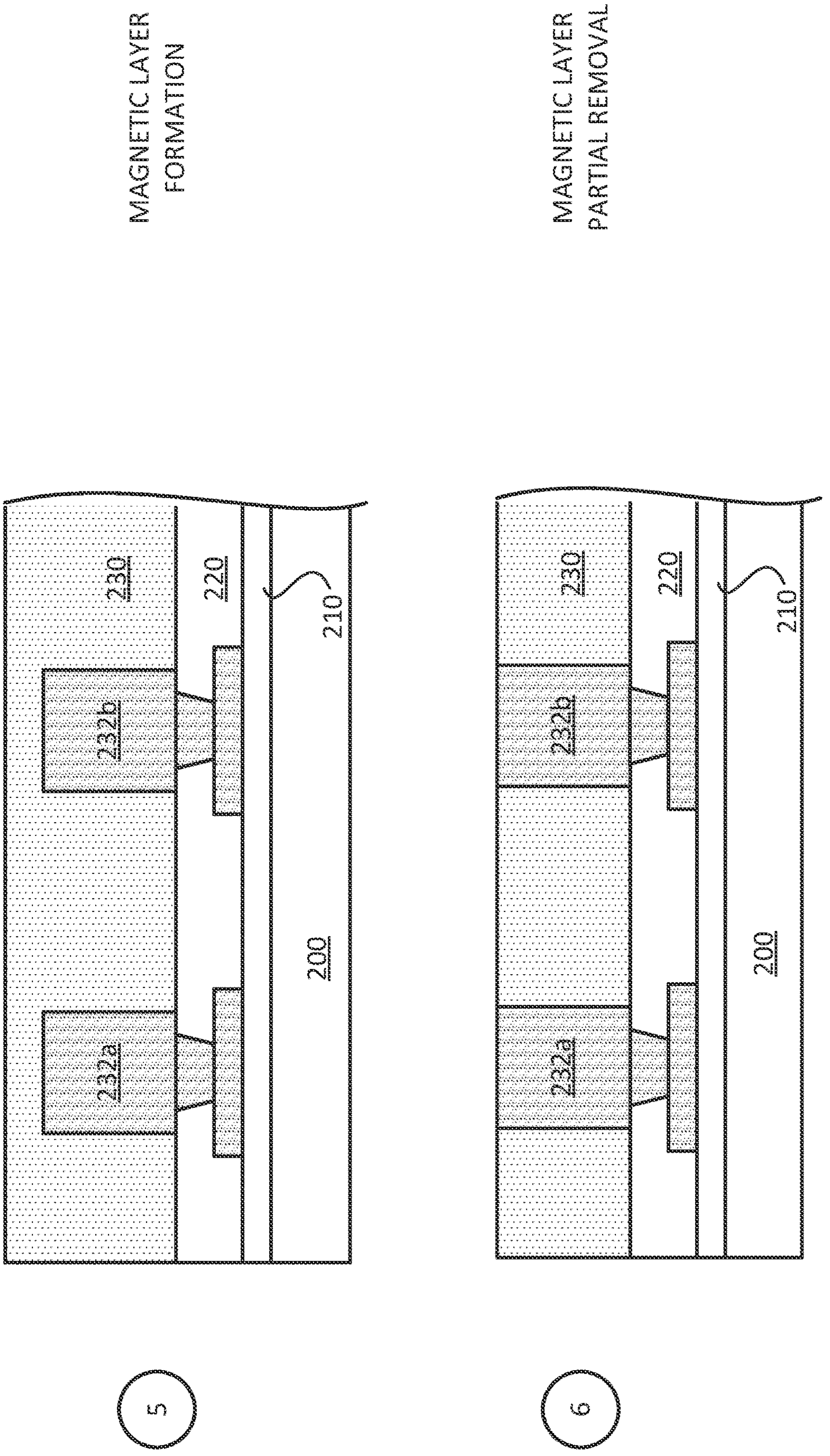

Stage 5, as shown in FIG. 10C, illustrates a state after a magnetic layer 230 is formed over the dielectric layer 220. A lamination process may be used to form the magnetic layer 230. A printing process may be used to form paste of the magnetic layer 230 over the dielectric layer 220. The magnetic layer 230 may at least laterally surround and touch the at least one interconnect 232. The magnetic layer 230 may be formed over the at least one interconnect 232.

Stage 6 illustrates a state after portions of the magnetic layer 230 are removed. A polishing process and/or a grinding process may be used to remove portions of the magnetic layer 230. Removing portions of the magnetic layer 230 exposes the at least one interconnect 232. It is noted that portions of the at least one interconnect 232 may also be removed through the polishing and/or grinding process.

Figure 10D:
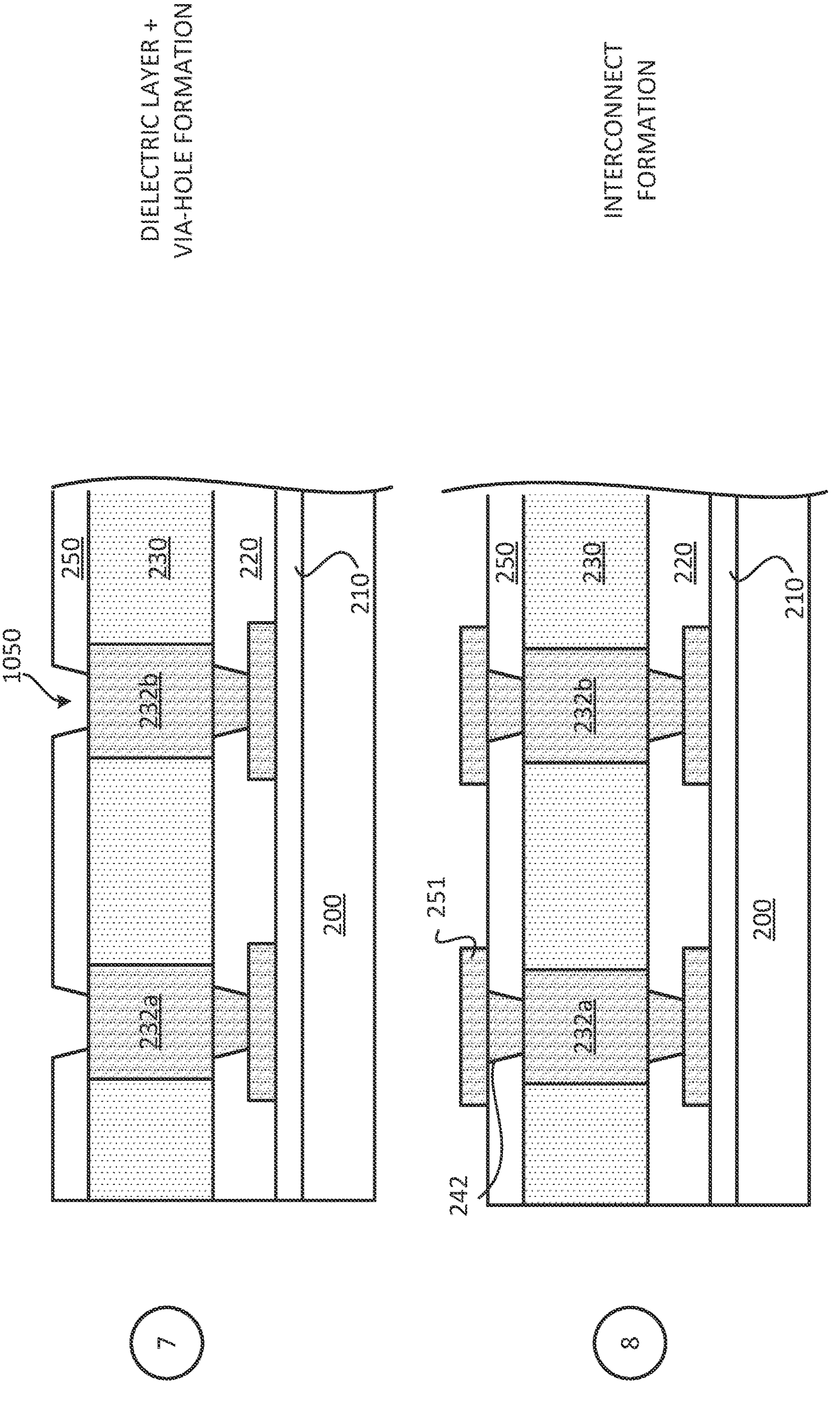

Stage 7, as shown in FIG. 10D, illustrates a state after at least one dielectric layer 240 is formed and patterned. A deposition, a lamination, an exposure, a development and/or an etching process may be used to form and pattern the at least one dielectric layer 240. The at least one dielectric layer 240 may be formed over the at least one interconnect 232 and the magnetic layer 230. The at least one dielectric layer 240 may include at least one via-hole 1050.

Stage 8 illustrates a state after the at least one interconnect 242 and at least one interconnect 251 are formed. A plating process and a patterning process may be used to form the at least one interconnect 242 and the at least one interconnect 251. Forming the at least one interconnect 242 may include forming via interconnects in the at least one via-hole 1050 of the at least one dielectric layer 240. The at least one interconnect 242 may be coupled to the at least one interconnect 232 and the at least one interconnect 251.

Figure 10E:
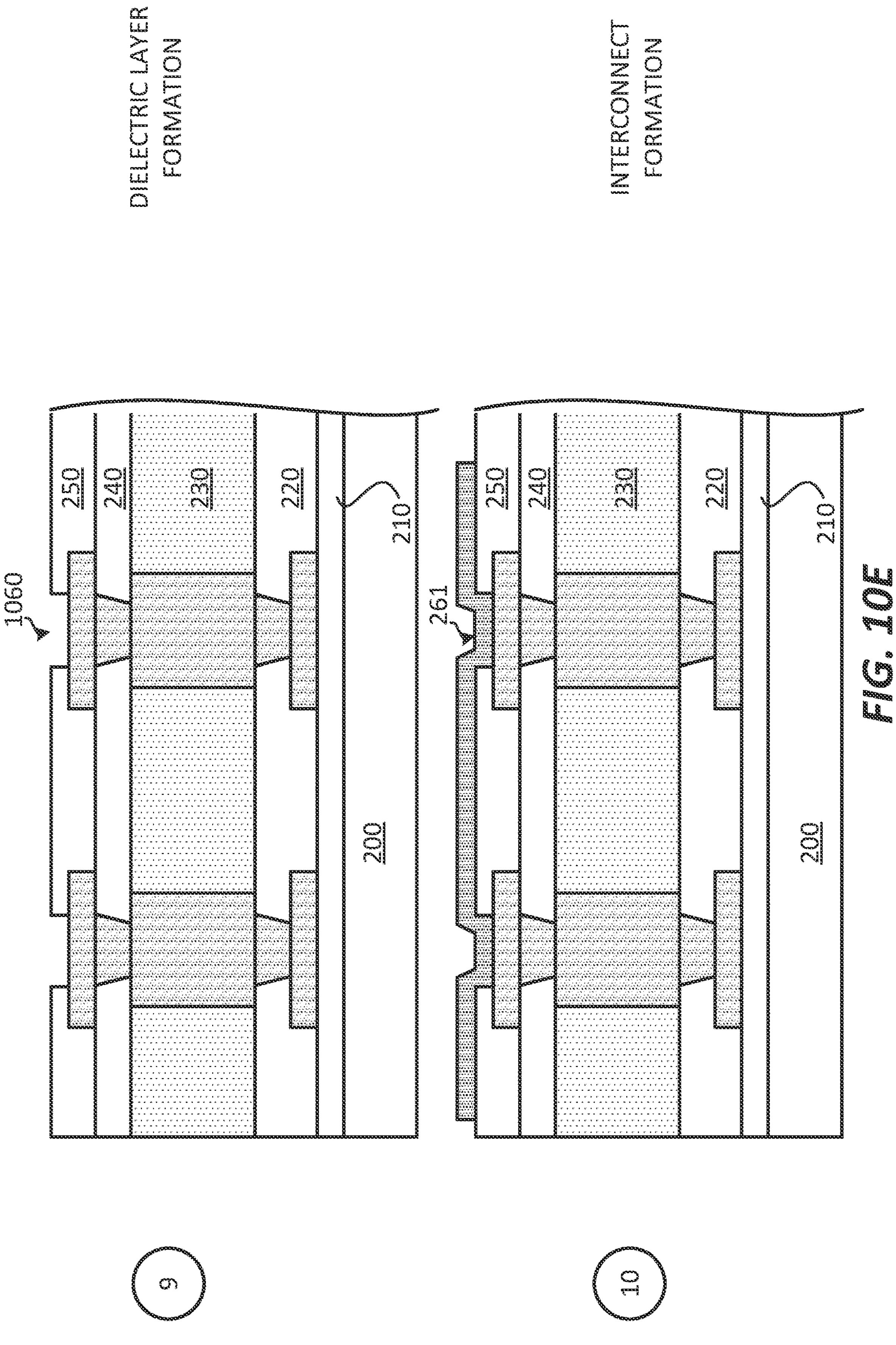

Stage 9, as shown in FIG. 10E, illustrates a state after at least one dielectric layer 250 is formed and patterned. A deposition, a lamination, an exposure, a development and/or an etching process may be used to form and pattern the at least one dielectric layer 250. The at least one dielectric layer 250 may be formed over the dielectric layer 240 and the at least one interconnect 251. The at least one dielectric layer 250 may include at least one via-hole 1060.

Stage 10 illustrates a state after the at least one interconnect 261 is formed. A plating process and a patterning process may be used to form the at least one interconnect 261. Forming the at least one interconnect 261 may include forming interconnects in the at least one via-hole 1060 of the at least one dielectric layer 250. The at least one interconnect 261 may be coupled to the at least one interconnect 251.

Figure 10F:
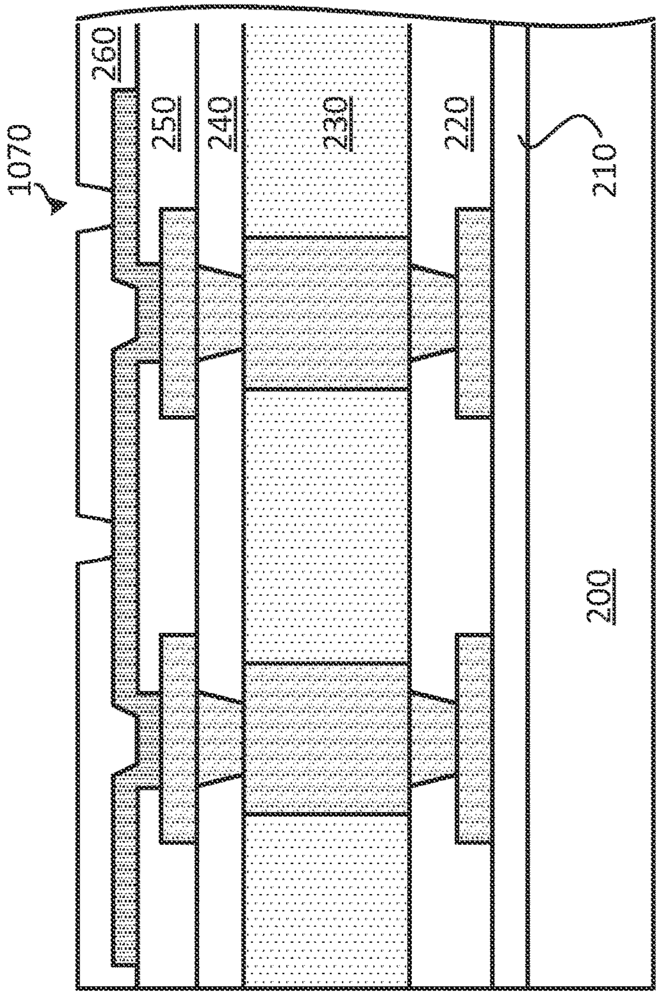

Stage 11, as shown in FIG. 10F, illustrates a state after at least one dielectric layer 260 is formed and patterned. A deposition, a lamination, an exposure, a development and/or an etching process may be used to form and pattern the at least one dielectric layer 260. The at least one dielectric layer 260 may be formed over the dielectric layer 260 and the at least one interconnect 261. The at least one dielectric layer 260 may include at least one via-hole 1070.

Figure 10G:
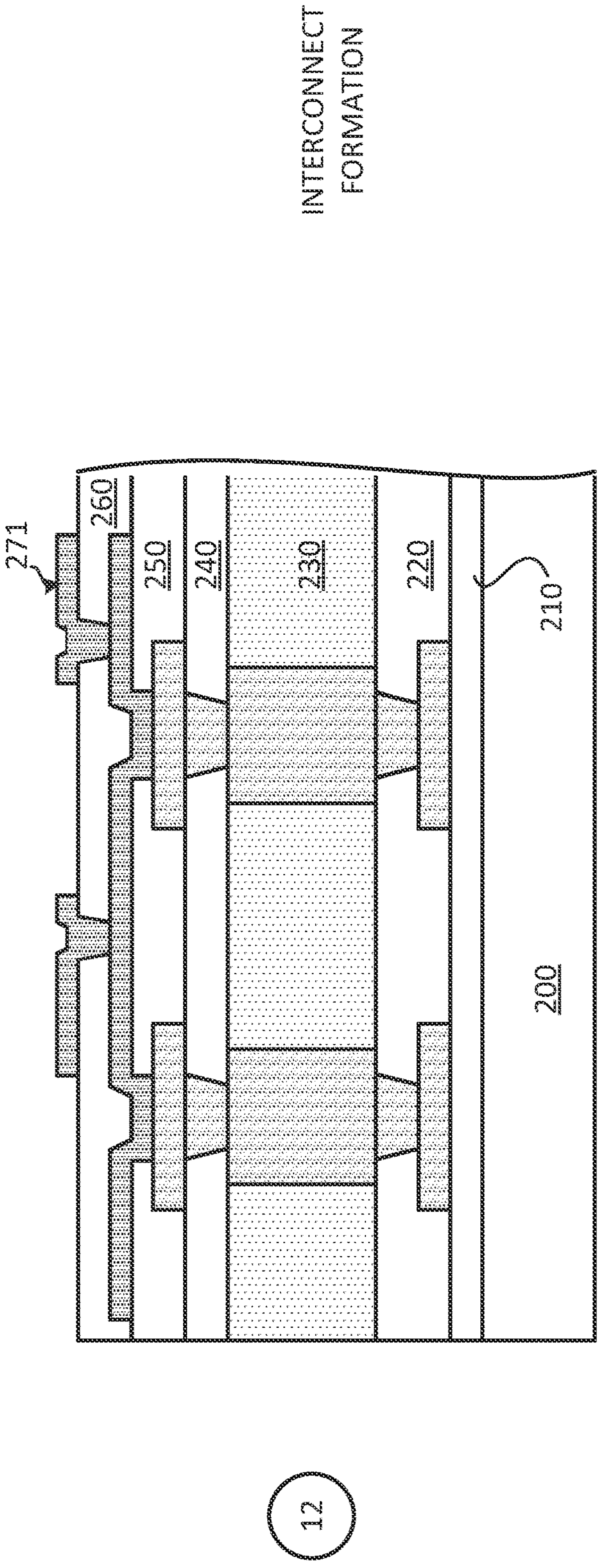

Stage 12, as shown in FIG. 10G, illustrates a state after the at least one interconnect 271 is formed. A plating process and a patterning process may be used to form the at least one interconnect 271. Forming the at least one interconnect 271 may include forming interconnects in the at least one via-hole 1070 of the at least one dielectric layer 260. The at least one interconnect 271 may be coupled to the at least one interconnect 261.

Figure 10H:
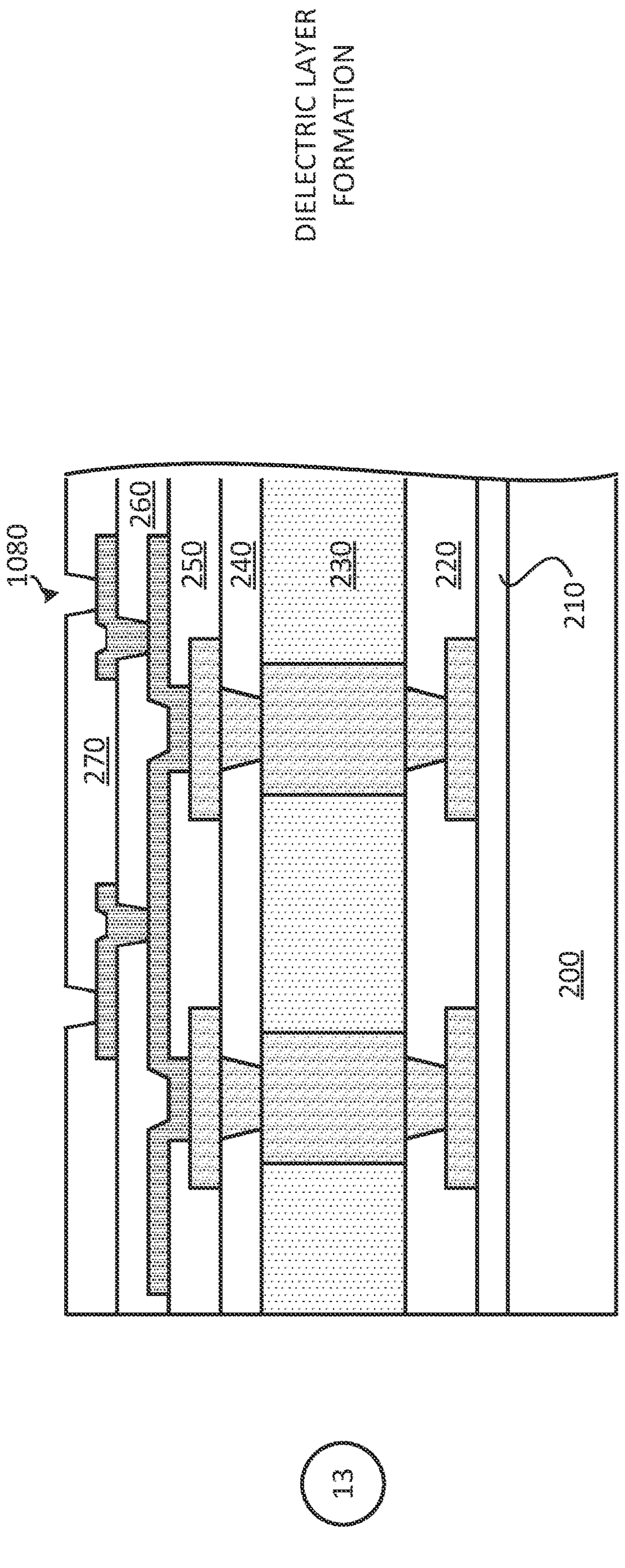

Stage 13, as shown in FIG. 10H, illustrates a state after at least one dielectric layer 270 is formed and patterned. A deposition, a lamination, an exposure, a development and/or an etching process may be used to form and pattern the at least one dielectric layer 270. The at least one dielectric layer 270 may be formed over the dielectric layer 270 and the at least one interconnect 271. The at least one dielectric layer 270 may include at least one via-hole 1080.

Figure 10I:
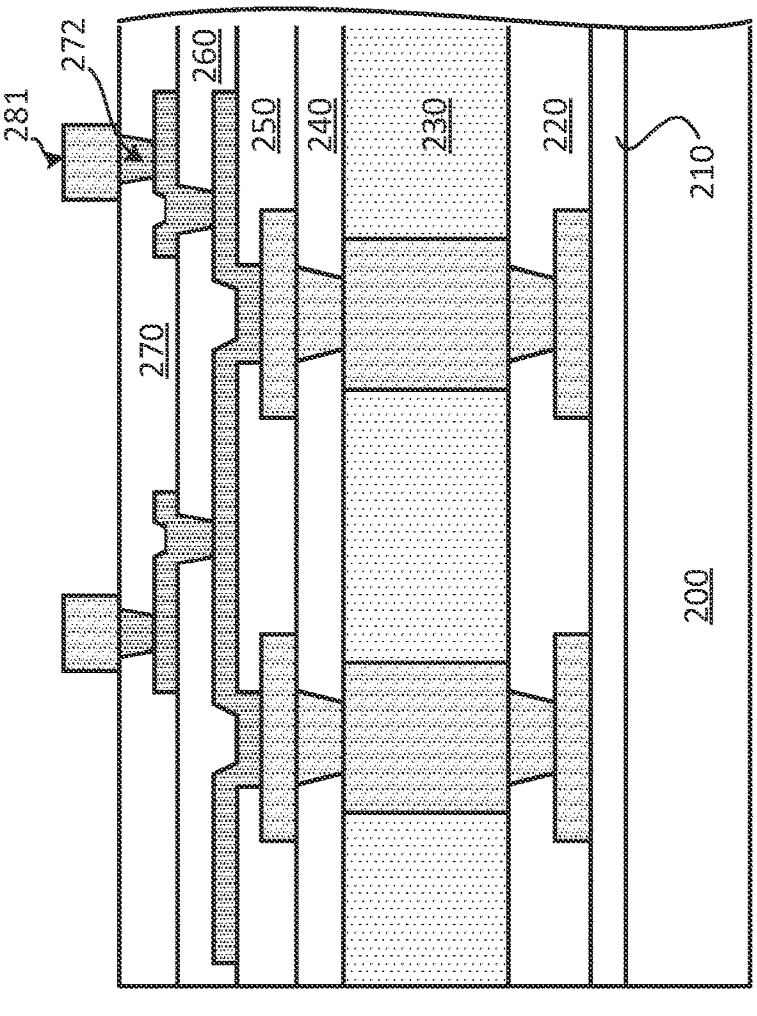

Stage 14, as shown in FIG. 10I, illustrates a state after the at least one interconnect 272 and at least one interconnect 281 are formed. A plating process and a patterning process may be used to form the at least one interconnect 272 and the at least one interconnect 281. Forming the at least one interconnect 272 may include forming via interconnects in the at least one via-hole 1080 of the at least one dielectric layer 270. The at least one interconnect 272 may be coupled to the at least one interconnect 271 and the at least one interconnect 281. The at least one interconnect 281 may include at least one pillar interconnect (e.g., bump pillar interconnect).

Figure 10J:
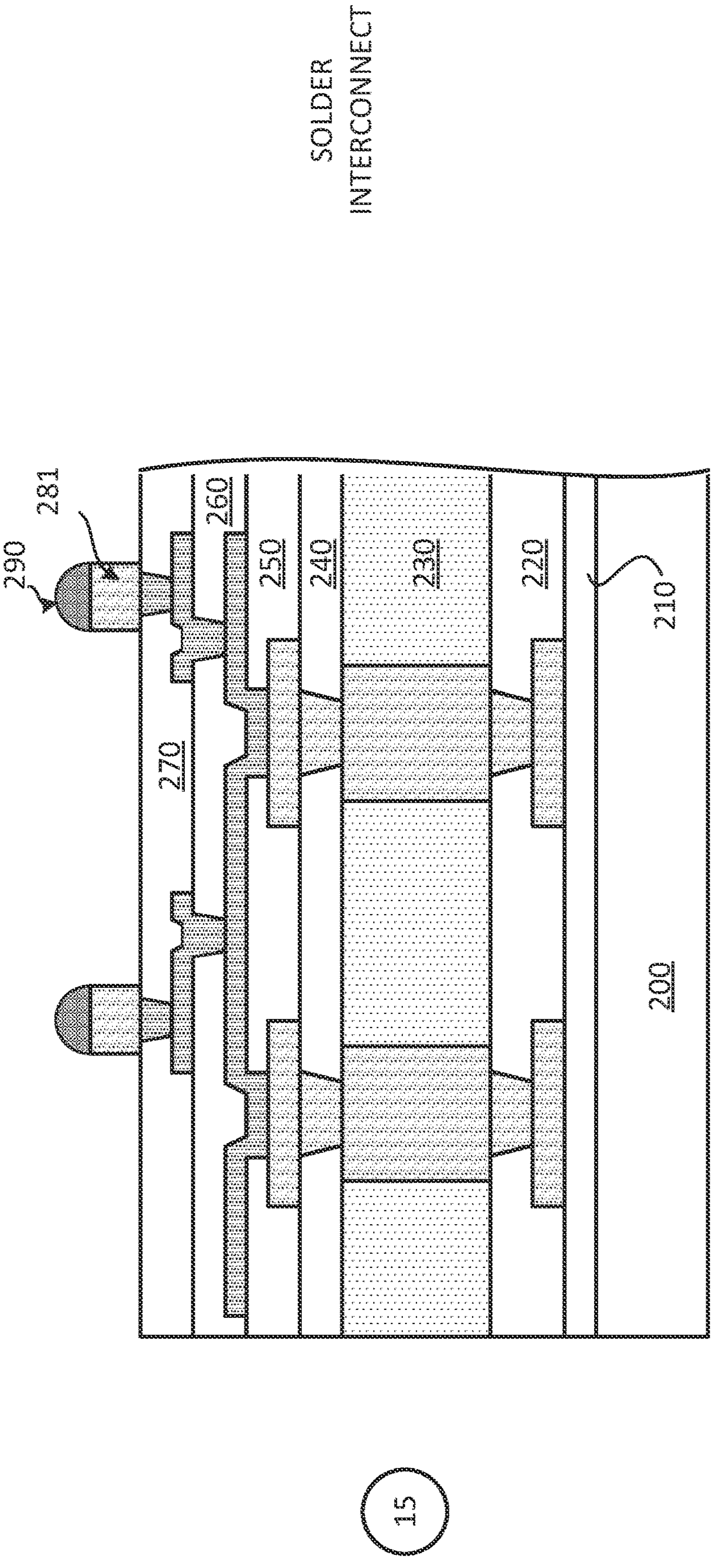

Stage 15, as shown in FIG. 10J, illustrates a state after a plurality of solder interconnects 290 are coupled the at least one interconnect 281. A solder reflow process may be used to couple the plurality of solder interconnects 290 to the at least one interconnect 281.

As mentioned above, the above sequence may be performed on a wafer (e.g., silicon wafer) such that several integrated devices are formed at the same time, and the wafer is then singulated to form individual integrated devices comprising a magnetic layer. The above sequence may be fabricated in one facility or at several facilities. For example, when a wafer includes an active portion and an interconnection portion, a portion that includes the magnetic layer may be fabricated over the interconnection portion. The wafer comprising the active portion, the interconnection portion and the magnetic layer may be singulated to form several integrated devices.

Figure 11:
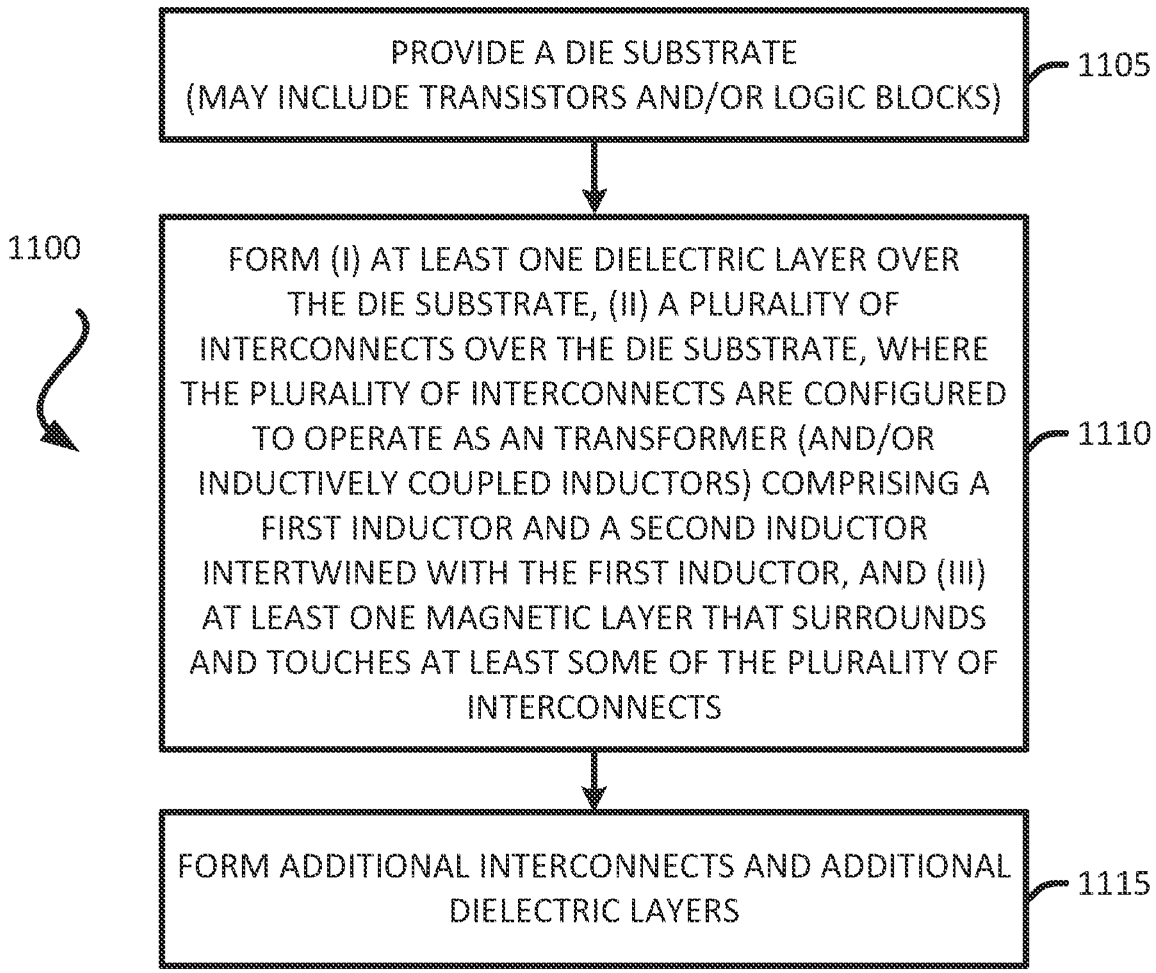
FIG. 11 illustrates an exemplary flow diagram of a method for fabricating an integrated passive device that includes a magnetic material that surrounds interconnects.

Exemplary Flow Diagram of a Method for Fabricating an Integrated Passive Device Comprising a Magnetic Layer In some implementations, fabricating an integrated passive device includes several processes. FIG. 11 illustrates an exemplary flow diagram of a method 1100 for providing or fabricating an integrated passive device that at least one magnetic layer. In some implementations, the method 1100 of FIG. 11 may be used to provide or fabricate the integrated passive device 105 and/or the integrated passive device 201. The method 1100 may be implemented on a wafer (e.g., silicon wafer) and then singulated into several integrated passive devices. The method 1100 may be used to provide or fabricate the integrated device 103 and/or the integrated device 801.

It should be noted that the method 1100 of FIG. 11 may combine one or more processes in order to simplify and/or clarify the method for providing or fabricating an integrated device. In some implementations, the order of the processes may be changed or modified.

The method provides (at 1105) a die substrate (e.g., 200). Stage 1, as shown in FIG. 10A, illustrates a state after a die substrate 200 is provided. The die substrate 200 may include silicon (Si). A dielectric layer 210 may be located over a surface of the die substrate 200. The die substrate 200 may be provided with the dielectric layer 210. In some implementations, the dielectric layer 210 may be formed over the surface of the die substrate 200. Providing the die substrate 200 may include providing a wafer (e.g., silicon wafer). In some implementations, a die substrate 200 may be provided with an active region that includes a plurality of transistors, filters and/or logic cells.

The method forms (at 1110) a dielectric layer over the die substrate, a plurality of interconnects that are configured to operate as a transformer (and/or inductively coupled inductors) comprising a first inductor and a second inductor, where the second inductor is intertwined with the first inductor, and at least one magnetic material that laterally surrounds part of the interconnects that define the transformer. Stage 2 of FIG. 10A through Stage 8 of FIG. 10D, illustrate and describe an example for forming at least one dielectric layer, a magnetic layer and a plurality of interconnects that may define a transformer (and/or inductively coupled inductors) that includes a first inductor and a second inductor.

Stage 2 of FIG. 10A, illustrates a state after at least one interconnect 221 is formed over the dielectric layer 210. A plating process and a patterning process may be used to form the at least one interconnect 221.

Stage 3, as shown in FIG. 10B, illustrates a state after at least one dielectric layer 220 is formed and patterned. A deposition, a lamination, an exposure, a development and/or an etching process may be used to form and pattern the at least one dielectric layer 220. The at least one dielectric layer 220 may be formed over and around the at least one interconnect 221. The at least one dielectric layer 220 may include at least one via-hole 1020.

Stage 4 illustrates a state after at least one interconnect 222 and at least one interconnect 232 are formed. A plating process and a patterning process may be used to form the at least one interconnect 222 and the at least one interconnect 232. Forming the at least one interconnect 222 may include forming via interconnects in the at least one via-hole 1020 of the at least one dielectric layer 220. The at least one interconnect 222 may be coupled to the at least one interconnect 221 and the at least one interconnect 232. The at least one interconnect 232 includes an interconnect 232*a* and an interconnect 232*b*. A width of the at least one interconnect 232 may be greater than a width of the at least one interconnect 222.

Stage 5, as shown in FIG. 10C, illustrates a state after a magnetic layer 230 is formed over the dielectric layer 220. A lamination process may be used to form the magnetic layer 230. A printing process may be used to form paste of the magnetic layer 230 over the dielectric layer 220. The magnetic layer 230 may at least laterally surround and touch the at least one interconnect 232. The magnetic layer 230 may be formed over the at least one interconnect 232.

Stage 6 illustrates a state after portions of the magnetic layer 230 are removed. A polishing process and/or a grinding process may be used to remove portions of the magnetic layer 230. Removing portions of the magnetic layer 230 exposes the at least one interconnect 232. It is noted that portions of the at least one interconnect 232 may also be removed through the polishing and/or grinding process.

Stage 7, as shown in FIG. 10D, illustrates a state after at least one dielectric layer 240 is formed and patterned. A deposition, a lamination, an exposure, a development and/or an etching process may be used to form and pattern the at least one dielectric layer 240. The at least one dielectric layer 240 may be formed over the at least one interconnect 232 and the magnetic layer 230. The at least one dielectric layer 240 may include at least one via-hole 1050.

Stage 8 illustrates a state after the at least one interconnect 242 and at least one interconnect 251 are formed. A plating process and a patterning process may be used to form the at least one interconnect 242 and the at least one interconnect 251. Forming the at least one interconnect 242 may include forming via interconnects in the at least one via-hole 1050 of the at least one dielectric layer 240. The at least one interconnect 242 may be coupled to the at least one interconnect 232 and the at least one interconnect 251.

The method forms (at 1115) additional dielectric layers and additional interconnects. Stage 9 of FIG. 10E through Stage 14 of FIG. 10I, illustrate an example of forming additional dielectric layers and additional interconnects.

Stage 9, as shown in FIG. 10E, illustrates a state after at least one dielectric layer 250 is formed and patterned. A deposition, a lamination, an exposure, a development and/or an etching process may be used to form and pattern the at least one dielectric layer 250. The at least one dielectric layer 250 may be formed over the dielectric layer 240 and the at least one interconnect 251. The at least one dielectric layer 250 may include at least one via-hole 1060.

Stage 10 illustrates a state after the at least one interconnect 261 is formed. A plating process and a patterning process may be used to form the at least one interconnect 261. Forming the at least one interconnect 261 may include forming interconnects in the at least one via-hole 1060 of the at least one dielectric layer 250. The at least one interconnect 261 may be coupled to the at least one interconnect 251.

Stage 11, as shown in FIG. 10F, illustrates a state after at least one dielectric layer 260 is formed and patterned. A deposition, a lamination, an exposure, a development and/or an etching process may be used to form and pattern the at least one dielectric layer 260. The at least one dielectric layer 260 may be formed over the dielectric layer 260 and the at least one interconnect 261. The at least one dielectric layer 260 may include at least one via-hole 1070.

Stage 12, as shown in FIG. 10G, illustrates a state after the at least one interconnect 271 is formed. A plating process and a patterning process may be used to form the at least one interconnect 271. Forming the at least one interconnect 271 may include forming interconnects in the at least one via-hole 1070 of the at least one dielectric layer 260. The at least one interconnect 271 may be coupled to the at least one interconnect 261.

Stage 13, as shown in FIG. 10H, illustrates a state after at least one dielectric layer 270 is formed and patterned. A deposition, a lamination, an exposure, a development and/or an etching process may be used to form and pattern the at least one dielectric layer 270. The at least one dielectric layer 270 may be formed over the dielectric layer 270 and the at least one interconnect 271. The at least one dielectric layer 270 may include at least one via-hole 1080.

Stage 14, as shown in FIG. 10I, illustrates a state after the at least one interconnect 272 and at least one interconnect 281 are formed. A plating process and a patterning process may be used to form the at least one interconnect 272 and the at least one interconnect 281. Forming the at least one interconnect 272 may include forming via interconnects in the at least one via-hole 1080 of the at least one dielectric layer 270. The at least one interconnect 272 may be coupled to the at least one interconnect 271 and the at least one interconnect 281. The at least one interconnect 281 may include at least one pillar interconnect (e.g., bump pillar interconnect).

Figure 12:
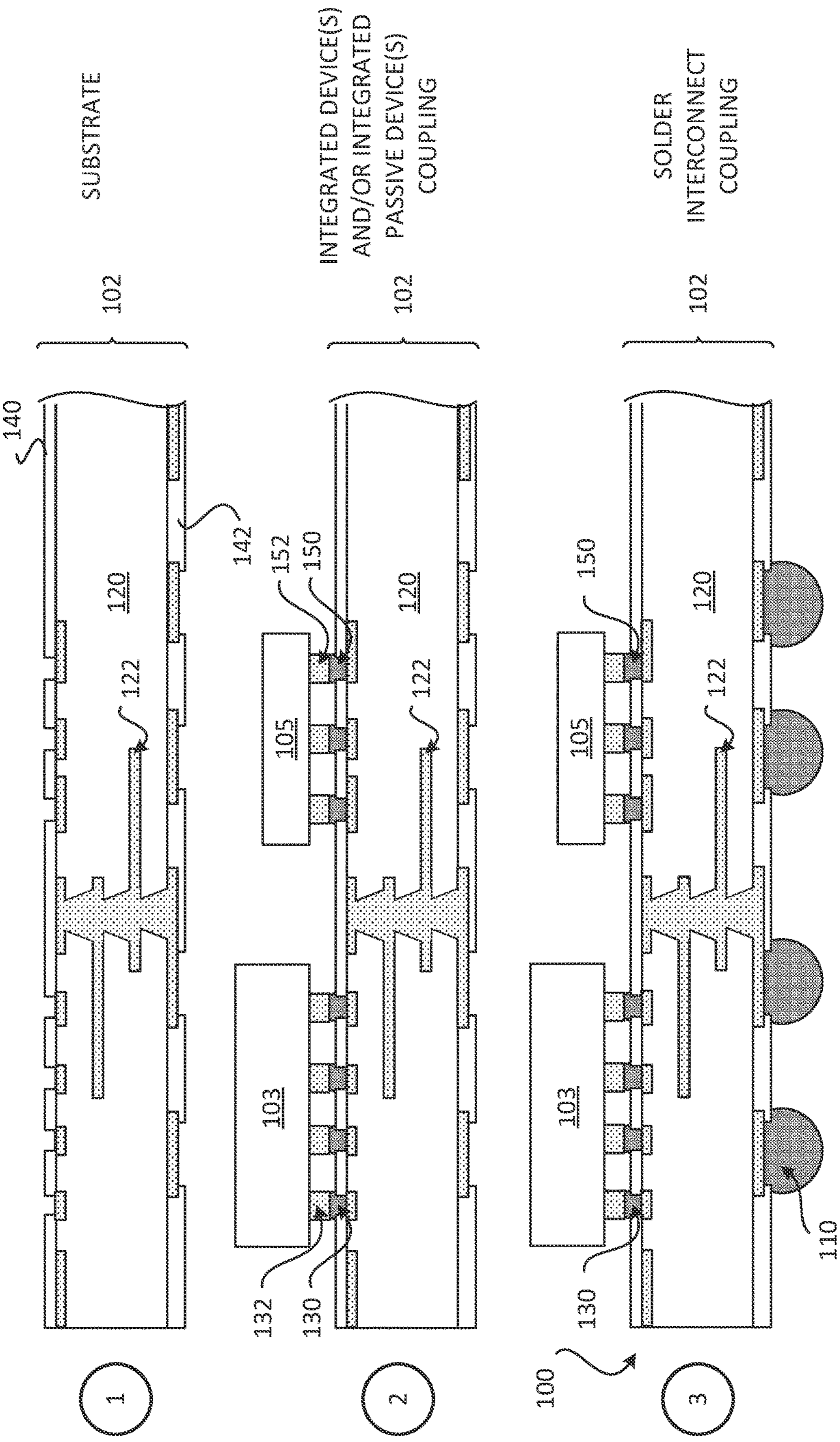
FIG. 12 illustrates an exemplary sequence for fabricating a package that includes a substrate, an integrated device and an integrated passive device.

Exemplary Sequence for Fabricating a Package that Includes an Integrated Device and an Integrated Passive Device FIG. 12 illustrates an exemplary sequence for providing or fabricating a package that includes an integrated device comprising a magnetic layer and/or an integrated passive device comprising a magnetic layer. In some implementations, the sequence of FIG. 12 may be used to provide or fabricate the package 100 that includes an integrated device and/or the integrated passive device.

It should be noted that the sequence of FIG. 12 may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIG. 12 may be used to fabricate one package or several packages at a time (as part of a wafer).

Stage 1, as shown in FIG. 12, illustrates a state after the substrate 102 is provided. The substrate 102 may be provided by a supplier or fabricated. The substrate 102 includes at least one dielectric layer 120 and a plurality of interconnects 122, a solder resist layer 140 and a solder resist layer 142. The substrate 102 may include an embedded trace substrate (ETS). In some implementations, the at least one dielectric layer 120 may include prepreg layer(s).

Stage 2 illustrates a state after the integrated device 103 is coupled to a first surface (e.g., top surface) of the substrate 102. The integrated device 103 may be coupled to the substrate 102 through a plurality of pillar interconnects 132 and a plurality of solder interconnects 130. In some implementations, the plurality of pillar interconnects 132 may be optional. The plurality of solder interconnects 130 are coupled to the plurality of interconnects 122. A solder reflow process may be used to couple the integrated device 103 to the plurality of interconnects 122 through the plurality of solder interconnects 130. The integrated device 103 may include inductive coupled inductors, a transformer, and/or a magnetic layer, as described in the disclosure.

Stage 2 also illustrates a state after the integrated passive device 105 is coupled to the first surface (e.g., top surface) of the substrate 102. The integrated passive device 105 may be coupled to the substrate 102 through a plurality of pillar interconnects 152 and a plurality of solder interconnects 150. In some implementations, the plurality of pillar interconnects 152 may be optional. The plurality of solder interconnects 150 are coupled to the plurality of interconnects 122. A solder reflow process may be used to couple the integrated passive device 105 to the plurality of interconnects 122 through the plurality of solder interconnects 150. The integrated passive device 105 may include inductive coupled inductors, a transformer, and/or a magnetic layer, as described in the disclosure.

Stage 3 illustrates a state after a plurality of solder interconnects 110 are couped to the substrate 102. The plurality of solder interconnects 110 may be couple to interconnects that are located over a second surface of the at least one dielectric layer 120. A solder reflow process may be used to couple the plurality of solder interconnects 110 to the substrate 102. Stage 3 may illustrate the package 100. The packages (e.g., 100) described in the disclosure may be fabricated one at a time or may be fabricated together as part of one or more wafers and then singulated into individual packages.

Figure 13:
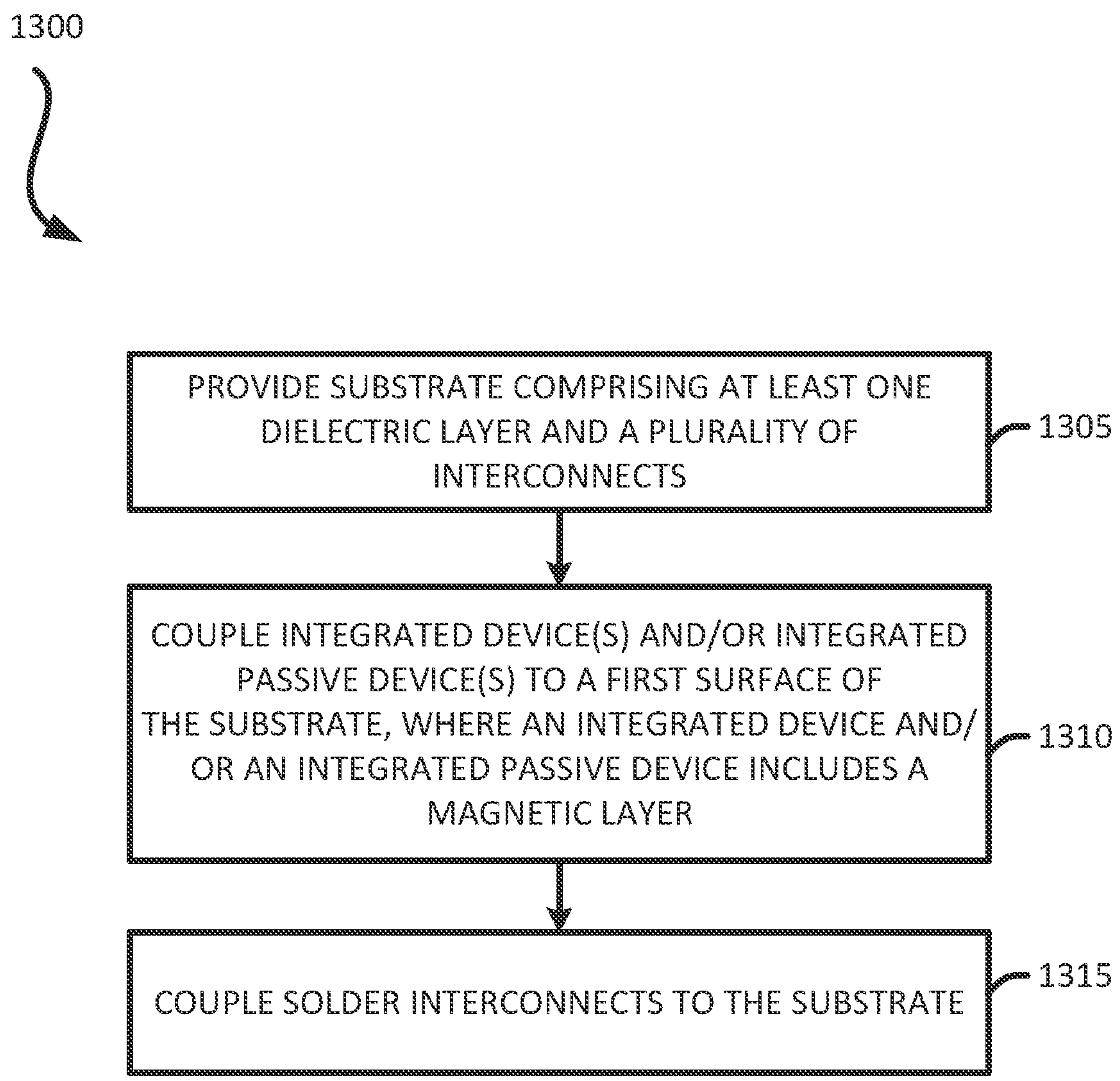
FIG. 13 illustrates an exemplary flow diagram of a method for fabricating a package that includes a substrate, an integrated device and an integrated passive device.

Exemplary Flow Diagram of a Method for Fabricating a Package that Includes an Integrated Device and an Integrated Passive Device In some implementations, fabricating a package that includes an integrated device comprising a magnetic layer and/or an integrated passive device comprising a magnetic layer, includes several processes. FIG. 13 illustrates an exemplary flow diagram of a method 1300 for providing or fabricating package that includes an integrated device comprising a magnetic layer and/or an integrated passive device comprising a magnetic layer. In some implementations, the method 1300 of FIG. 13 may be used to provide or fabricate the package 100 of FIG. 1 described in the disclosure. However, the method 1300 may be used to provide or fabricate any of the packages described in the disclosure.

It should be noted that the method of FIG. 13 may combine one or more processes in order to simplify and/or clarify the method for providing or fabricating a package that includes an integrated device comprising a magnetic layer and/or an integrated passive device comprising a magnetic layer. In some implementations, the order of the processes may be changed or modified.

The method provides (at 1305) a substrate (e.g., 102). The substrate 102 may be provided by a supplier or fabricated. The substrate 102 includes at least one dielectric layer 120, and a plurality of interconnects 122. The substrate 102 may include an embedded trace substrate (ETS). In some implementations, the at least one dielectric layer 120 may include prepreg layers. Stage 1 of FIG. 12 illustrates and describes an example of providing a substrate with escape interconnects.

The method couples (at 1310) at least one integrated device (e.g., 103) to the first surface of the substrate (e.g., 102). For example, the integrated device 103 may be coupled to the substrate 102 through the plurality of pillar interconnects 132 and the plurality of solder interconnects 130. The plurality of pillar interconnects 132 may be optional. The plurality of solder interconnects 130 are coupled to the plurality of interconnects 122. A solder reflow process may be used to couple the integrated device 103 to the plurality of interconnects through the plurality of solder interconnects 130. The integrated device 103 may include inductive coupled inductors, a transformer, and/or a magnetic layer, as described in the disclosure.

The method also couples (at 1310) at least one integrated passive device (e.g., 105) to the first surface of the substrate (e.g., 102). For example, the integrated passive device 105 may be coupled to the substrate 102 through the plurality of pillar interconnects 152 and the plurality of solder interconnects 150. The plurality of pillar interconnects 152 may be optional. The plurality of solder interconnects 150 are coupled to the plurality of interconnects 122. A solder reflow process may be used to couple the integrated passive device 105 to the plurality of interconnects through the plurality of solder interconnects 150. The integrated passive device 105 may include inductive coupled inductors, a transformer, and/or a magnetic layer, as described in the disclosure. Stage 2 of FIG. 12 illustrates and describes an example of an integrated device and an integrated passive device coupled to a substrate.

The method couples (at 1315) a plurality of solder interconnects (e.g., 110) to the second surface of the substrate (e.g., 102). A solder reflow process may be used to couple the plurality of solder interconnects 110 to the substrate. Stage 3 of FIG. 12 illustrates and describes an example of coupling solder interconnects to the substrate.

Exemplary Electronic Devices

Figure 14:
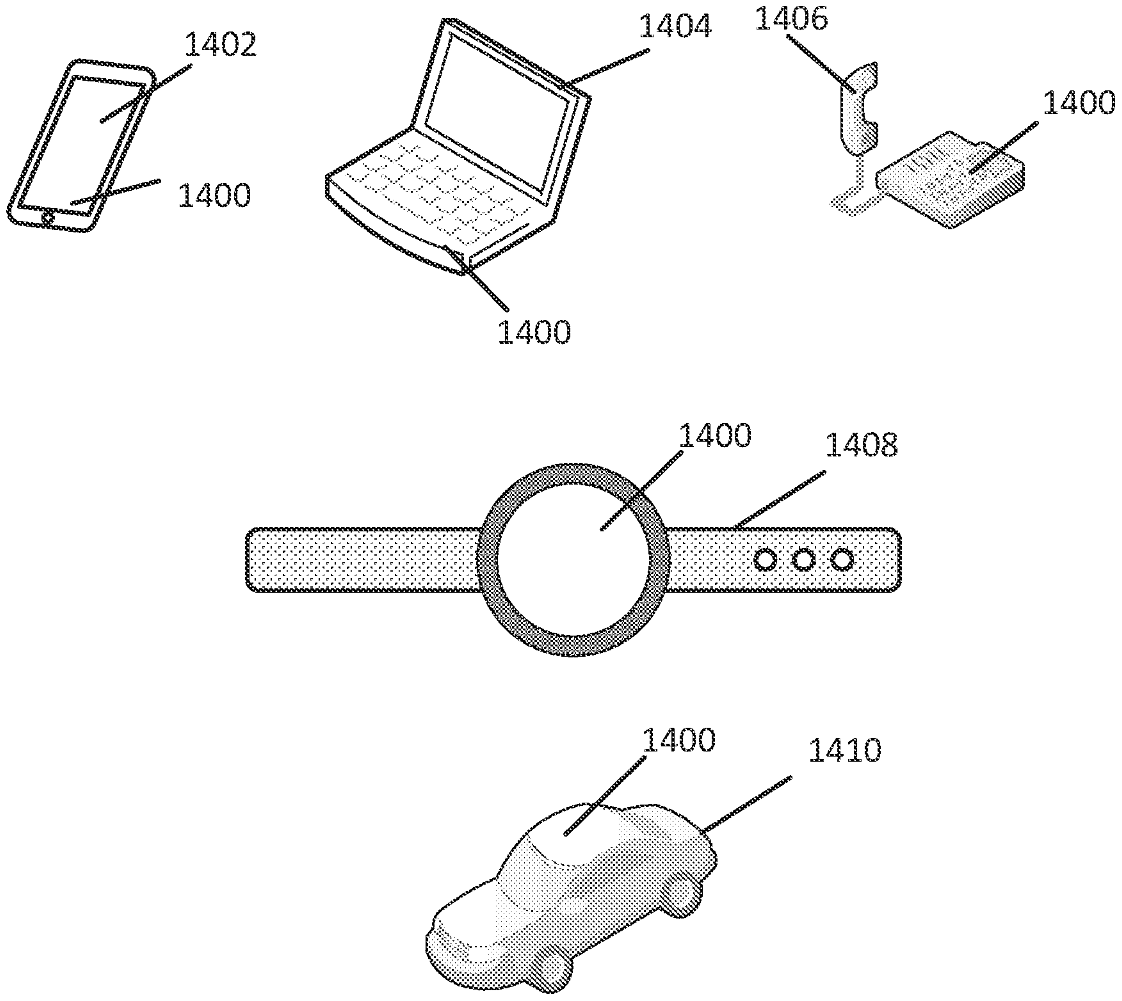
FIG. 14 illustrates various electronic devices that may integrate a die, an electronic circuit, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-9, 10A-10J and/or 11-14 may be rearranged and/or combined into a single component, process, feature or function or embodied in several components, processes, or functions. Additional elements, components, processes, and/or functions may also be added without departing from the disclosure. It should also be noted FIGS. 1-9, 10A-10J and/or 11-14 and its corresponding description in the present disclosure is not limited to dies and/or ICs. In some implementations, FIGS. 1-9, 10A-10J and/or 11-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object that is coupled to another object may be coupled to at least part of the another object. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A device comprising a die substrate; a plurality of interconnects located over the die substrate, wherein the plurality of interconnects comprise a first plurality of interconnects comprising a first plurality of via interconnects, wherein the first plurality of interconnects are configured as a first inductor; and a second plurality of interconnects comprising a second plurality of via interconnects, wherein the second plurality of interconnects are configured as a second inductor, wherein the first inductor and the second inductor are intertwined, at least one magnetic layer that surrounds at least part of the first plurality of via interconnects and at least part of the second plurality of via interconnects; and at least one dielectric layer located over the die substrate.

Aspect 2: The device of aspect 1, wherein the first inductor and the second inductor are configured as a transformer or inductively coupled inductors.

Aspect 3: The device of aspects 1 through 2, wherein the first inductor includes a first solenoid inductor, and wherein the second inductor includes a second solenoid inductor that is intertwined with the first solenoid inductor.

Aspect 4: The device of aspects 1 through 3, further comprising a plurality of transistors located in the die substrate.

Aspect 5: The device of aspects 1 through 4, wherein the plurality of interconnects include a plurality of redistribution interconnects.

Aspect 6: The device of aspect 5, wherein the plurality of redistribution interconnects includes one or more redistribution metal layers.

Aspect 7: The device of aspects 1 through 6, wherein the at least one magnetic layer includes an insulating layer and/or a dielectric layer.

Aspect 8: The device of aspects 1 through 7, wherein the at least one magnetic layer includes a non-electrical conducting material.

Aspect 9: The device of aspects 1 through 8, wherein the at least one magnetic layer has a relative permeability value that is greater than 1.

Aspect 10: The device of aspects 1 through 9, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 11: A method comprising providing a die substrate; forming a plurality of interconnects located over the die substrate, wherein the plurality of interconnects comprise: a first plurality of interconnects comprising a first plurality of via interconnects, wherein the first plurality of interconnects are configured as a first inductor; and a second plurality of interconnects comprising a second plurality of via interconnects, wherein the second plurality of interconnects are configured as a second inductor, wherein the first inductor and the second inductor are intertwined, forming at least one magnetic layer that surrounds at least part of the first plurality of via interconnects and at least part of the second plurality of via interconnects; and forming at least one dielectric layer located over the die substrate.

Aspect 12: The method of aspect 11, wherein the first inductor and the second inductor are configured as a transformer or inductively coupled inductors.

Aspect 13: The method of aspects 11 through 12, wherein the first inductor includes a first solenoid inductor, and wherein the second inductor includes a second solenoid inductor that is intertwined with the first solenoid inductor.

Aspect 14: The method of aspects 11 through 13, further comprising a plurality of transistors located in the die substrate.

Aspect 15: The method of aspects 11 through 14, wherein the plurality of interconnects include a plurality of redistribution interconnects.

Aspect 16: The method of aspect 15, wherein the plurality of redistribution interconnects includes one or more redistribution metal layers.

Aspect 17: The method of aspects 11 through 16, wherein the at least one magnetic layer includes an insulating layer and/or a dielectric layer.

Aspect 18: The method of aspects 11 through 17, wherein the at least one magnetic layer includes a non-electrical conducting material.

Aspect 19: The method of claim 1, wherein the at least one magnetic layer has a relative permeability value that is greater than 1.

Aspect 20: The method of aspects 11 through 19, wherein the at least one magnetic layer, the first inductor and the second inductor are part of an integrated passive device or an integrated device.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
a die substrate;
a plurality of interconnects located over the die substrate, wherein the plurality of interconnects comprise:
a first plurality of interconnects comprising a first plurality of via interconnects,
wherein the first plurality of via interconnects comprise:
a first via interconnect; and
a second via interconnect coupled to and touching the first via interconnect, and
wherein the first plurality of interconnects are configured as a first inductor; and
a second plurality of interconnects comprising a second plurality of via interconnects,
wherein the second plurality of via interconnects comprise:
a third via interconnect; and
a fourth via interconnect coupled to and touching the third via interconnect, and
wherein the second plurality of interconnects are configured as a second inductor,
wherein the first inductor and the second inductor are intertwined,
at least one magnetic layer that surrounds (i) at least part of the first via interconnect from the first plurality of via interconnects and (ii) at least part of the third via interconnect from the second plurality of via interconnects; and
at least one dielectric layer located over the die substrate.

2. The device of claim 1, wherein the first inductor and the second inductor are configured as a transformer or inductively coupled inductors.

3. The device of claim 1,
wherein the first inductor includes a first solenoid inductor, and
wherein the second inductor includes a second solenoid inductor that is intertwined with the first solenoid inductor.

4. The device of claim 1, further comprising a plurality of transistors located in the die substrate.

5. The device of claim 1,
wherein the plurality of interconnects include a plurality of redistribution interconnects, and
wherein the fourth via interconnect is a redistribution interconnect from the plurality of redistribution interconnects.

6. The device of claim 5, wherein the plurality of redistribution interconnects includes one or more redistribution metal layers.

7. The device of claim 1, wherein the at least one magnetic layer includes an insulating layer and/or a dielectric layer.

8. The device of claim 1,
wherein the at least one magnetic layer includes a non-electrical conducting material, and
wherein the at least one magnetic layer has a relative permeability value that is greater than 1.

9. The device of claim 1,
wherein the at least one magnetic layer touches (i) at least part of the first via interconnect from the first plurality of via interconnects and (ii) at least part of the third via interconnect from the second plurality of via interconnects,
wherein the first via interconnect has a first width and the second via interconnect has a second width, and
wherein the first width is greater than the second width.

10. The device of claim 1, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. A method comprising:
providing a die substrate;
forming a plurality of interconnects located over the die substrate,
wherein the plurality of interconnects comprise:
a first plurality of interconnects comprising a first plurality of via interconnects,
wherein the first plurality of via interconnects comprise:
a first via interconnect; and
a second via interconnect coupled to and touching the first via interconnect, wherein the first plurality of interconnects are configured as a first inductor; and a second plurality of interconnects comprising a second plurality of via interconnects, wherein the second plurality of via interconnects comprise:

a third via interconnect; and a fourth via interconnect coupled to and touching the third via interconnect, wherein the second plurality of interconnects are configured as a second inductor, wherein the first inductor and the second inductor are intertwined, forming at least one magnetic layer that surrounds (i) at least part of the first via interconnect from the first plurality of via interconnects and (ii) at least part of the third via interconnect from the second plurality of via interconnects; and forming at least one dielectric layer located over the die substrate.

12. The method of claim 11, wherein the first inductor and the second inductor are configured as a transformer or inductively coupled inductors.

13. The method of claim 11, wherein the first inductor includes a first solenoid inductor, and wherein the second inductor includes a second solenoid inductor that is intertwined with the first solenoid inductor.

14. The method of claim 11, further comprising a plurality of transistors located in the die substrate.

15. The method of claim 11, wherein the plurality of interconnects include a plurality of redistribution interconnects, and wherein the fourth via interconnect is a redistribution interconnect from the plurality of redistribution interconnects.

16. The method of claim 15, wherein the plurality of redistribution interconnects includes one or more redistribution metal layers.

17. The method of claim 11, wherein the at least one magnetic layer includes an insulating layer and/or a dielectric layer.

18. The method of claim 11, wherein the at least one magnetic layer includes a non-electrical conducting material, and wherein the at least one magnetic layer has a relative permeability value that is greater than 1.

19. The method of claim 11, wherein the at least one magnetic layer touches (i) at least part of the first via interconnect from the first plurality of via interconnects and (ii) at least part of the third via interconnect from the second plurality of via interconnects, wherein the first via interconnect has a first width and the second via interconnect has a second width, and wherein the first width is greater than the second width.

20. The method of claim 11, wherein the at least one magnetic layer, the first inductor and the second inductor are part of an integrated passive device or an integrated device.

* * * * *